United States Patent
Osaka et al.

(10) Patent No.: US 7,095,661 B2
(45) Date of Patent: Aug. 22, 2006

(54) SEMICONDUCTOR MEMORY MODULE, MEMORY SYSTEM, CIRCUIT, SEMICONDUCTOR DEVICE, AND DIMM

(75) Inventors: Hideki Osaka, Oiso (JP); Yoji Nishio, Tokyo (JP); Seiji Funaba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/019,274

(22) Filed: Dec. 23, 2004

(65) Prior Publication Data

US 2005/0174878 A1    Aug. 11, 2005

(30) Foreign Application Priority Data

Dec. 25, 2003  (JP)  ............................. 2003-428621
Dec. 16, 2004  (JP)  ............................. 2004-364743

(51) Int. Cl.
*G11C 99/00*  (2006.01)

(52) U.S. Cl. ....................................... 365/194; 365/233
(58) Field of Classification Search ..................... None
See application file for complete search history.

(56) References Cited

U.S. PATENT DOCUMENTS

| | | | |
|---|---|---|---|
| 5,243,703 A | | 9/1993 | Farmwald et al. |
| 5,319,755 A | | 6/1994 | Farmwald et al. |
| 6,016,282 A | * | 1/2000 | Keeth .......................... 365/233 |
| 6,128,696 A | * | 10/2000 | Farmwald et al. .......... 711/105 |
| 6,438,012 B1 | | 8/2002 | Osaka et al. |
| 6,496,886 B1 | | 12/2002 | Osaka et al. |
| 6,574,154 B1 | * | 6/2003 | Sato et al. ................... 365/198 |
| 6,600,790 B1 | | 7/2003 | Umemura et al. |
| 6,845,460 B1 | * | 1/2005 | Lee et al. .................... 713/401 |
| 2001/0050856 A1 | * | 12/2001 | Matsuzaki ...................... 365/1 |
| 2002/0018526 A1 | | 2/2002 | Osaka et al. |
| 2003/0200407 A1 | | 10/2003 | Osaka et al. |

FOREIGN PATENT DOCUMENTS

| | | |
|---|---|---|
| JP | 10-133794 | 5/1998 |
| JP | 2000-132290 | 5/2000 |
| JP | 2001-27918 | 1/2001 |
| JP | 2001-27987 | 1/2001 |
| JP | 2001-331439 | 11/2001 |
| JP | 2002-123345 | 4/2002 |
| JP | 2003-271538 | 9/2003 |

* cited by examiner

*Primary Examiner*—Tan T. Nguyen
(74) *Attorney, Agent, or Firm*—Mattingly, Stanger, Malur & Brundidge, P.C.

(57) ABSTRACT

There is the problem that since C/A signals in a DIMM are distributed to respective DRAMs through a register in the DIMM and DQ signals are wired directly from terminals in the DIMM, their timing is difficult to synchronize. The register for speeding up the C/A signals of the DIMM that operates with high speed is provided, and a wiring from the register is set to a daisy-chain wiring. Then, by a timing adjustment circuit provided in the DRAM, a wiring delay time difference between the C/A signals and the clock signals, which are different depending on positions of the DRAMs, is such that the sum of a delay time from the register to each DRAM and a delay amount due to the timing adjustment circuit is made equal to a delay time of the farthest DRAM.

5 Claims, 19 Drawing Sheets

SEMICONDUCTOR MEMORY MODULE, MEMORY SYSTEM, CIRCUIT, SEMICONDUCTOR DEVICE, AND DIMM

CROSS-REFERENCE TO RELATED APPLICATION

The present application claims priority from Japanese patent application No. JP 2003-428621 filed on Dec. 25, 2003 and No. JP 2004-364743 filed on Dec. 16, 2004, the contents of which are hereby incorporated by reference into this application.

BACKGROUND OF THE INVENTION

The invention relates to a bus connecting technique for connecting a processor and functional circuits, which is used in an information processing apparatus, and to components thereof.

As a data rate is enhanced, a time for propagating a wiring between devices becomes increasingly equal to a data cycle. In particular, in a memory technique called a DDR (Double Data Rate)-SDRAM, an operating frequency of a command signal/address signal (hereinafter abbreviated as "C/A signal") is half of that of a data signal (hereinafter abbreviated as "DQ signal"). For example, in currently available products, data has a transfer rate of 400 Mbps while address has half of the transfer rate of the data, i.e., 200 Mbps.

In an equipment provided with a high-capacity DRAM including a personal computer, server, etc., to mount DRAMs with high density in many cases, 8 to approximately 18 DRAMs are mounted on one module (DIMM: Dual Inline Memory Module) and then 3 or 4 DIMMs are mounted on a motherboard.

FIG. 2 shows one DIMM 2 that is a conventional technique. In the one DIMM 2, DRAMs 10-1 to 10-8 operate in synchronization with one another. In a high-speed memory such as a DDR-SDRAM, a C/A signal 51 is driven to each of the DRAMs 10-1 to 10-8 by a buffer called a register 20. The register 20 once takes the C/A signal 51 from a memory controller 3, and redistributes it to multiple DRAMs 10-1 to 10-8 mounted as a C/A signal 51A on the DIMM 2.

Thus, in the DIMM 2, to a signal line extending to each DRAM from a terminal for signal of the DIMM 2, a DQ signal 52 is connected at an approximately one-to-one rate. In contrast, to the C/A signal 51A extending to each DRAM from the register is connected at an approximately one-to eighteen rate at maximum. The connection form thereof is achieved by a memory access method in which data of each DRAM is read from and written to the same address in the units of DIMM.

References that disclose a wiring technique for clock signals include Patent Document 1 (U.S. Pat. No. 5,243,703) and Patent Document 2 (U.S. Pat. No. 5,319,755). They disclose the technique for using a folded wiring as a clock and generating a intermediate phase of the clocks.

In addition, as a reference disclosing a technique for using a reflected wave of wirings, there is Patent Document 3 (U.S. Patent Application Laid-open No. 2002/018526). This discloses a method of generating a reflected wave at a far end serving as an open end.

SUMMARY OF THE INVENTION

As described previously, the wirings of the C/A signals 51A in the DIMM 2 are distributed to each of the DRAMs 10-1 to 10-8 through the register 20 in the DIMM 2 while the wirings of the DQ signals 52 are directly connected to terminals in the DIMM 2 so as to be shorter.

Clock signals 50A are distributed by a PLL (Phased Locked Loop) 30, and are tree-wired so as to have isometric wirings for the purpose of keeping timing of each of the DRAMs 10-1 to 10-8 constant. However, wiring efficiency thereof is not so high. This is because one signal can occupy a number of wiring channels.

Thus, in the conventional DIMM 2, the tree wiring is applied only to the clock signal 50A, but not to the C/A signal 51A. The C/A signal 51A includes a number of signals, so that if a tree-wiring structure is applied to the C/A signal, a wiring area is increased and the DIMM is enlarged and the number of wiring layers on a substrate is also increased. Hence, in the C/A signal 51A, it has been found out that a daisy chain wiring is formed from the register 20. The daisy chain line in this case means that in FIG. 2, a wiring is formed from a near place of the register 20 to a far place so as to draw a thing in one stroke. In other words, since the respective wiring lengths of the DRAMs 10-1 to 10-8 drawn from the register 20 are not equal, timing of the C/A signals 51 is different.

When the operating frequency of the C/A signal 51A is late, this does not cause any problem. This is because if a time difference of wiring delay falls within a timing margin, the C/A signal 51A operates. However, as the operating frequency of the C/A signal 51 is increased, the timing margin becomes short and the time difference due to a wiring length difference cannot be finally permitted. This is fundamentally caused by the problem that the clock signals 50A and the C/A signals 51A use different wiring schemes. That is, the clock signals 50A are wired so as to take the higher-speed data signals 52 well in advance and to have the same phases as those of the data signals 52 while the C/A signal 51A gives priority to the wiring density and is wired so as to draw a thing in on stroke.

Namely, a first problem in the conventional technique is as follows. That is, in the C/A signals wired from a near place of the DRAM to a far place so as to draw a thing in one stroke (wired into a daisy-chain shape) and in the DRAM on a memory module having clock signals isometrically wired in each of the DRAMS, if the C/A signals 51 are made high speed, the time difference of delay of the C/A signals 51 among the DRAMs 10-1 and 10-8 is in some cases longer than the timing margin necessary to stabilize the operations of the DRAMs.

In addition, a second problem in the conventional technique is as follows. That is, in the C/A signals wired from a near place of the DRAM to a far place so as to draw a thing in one stroke (wired into a daisy-chain shape) and in the DRAM on a memory module having clock signals isometrically wired in each of the DRAMS, the C/A signals 51 cannot be taken in due to a time difference depending on a wiring length difference between the clock signal 50 and the C/A signal 51.

Hence, in view of these problems, a first object of the present invention is to provide a system, in which the timing of data signals, C/A signals, and clock signals is matched so as to permit the wiring length difference, by means of a method of implementing them at lower costs and without increasing the wiring density and the number of substrate layers.

Also, a second object of the present invention is to provide a system for eliminating the wiring length difference between the C/A signals and the clock signals and having consistency in the timing of both signals.

As a first means to solve the first problem, a clock timing adjustment circuit is provided in the DRAM that adjusts timing of the internal clock signals for taking in the C/A signals.

As a second means to solve the first problem, a C/A signal timing adjustment circuit is provided in the DRAM that adjusts timing of the C/A signals.

As a first means to solve the second problem, in the DIMM, there is provided a second clock signal wiring, which is wired from the nearer DRAM in a Phase Locked Loop (PLL) circuit to the farther DRAM therein in a daisy-chain shape and which is terminated at the farthest end of the wiring.

As a second means to solve the second problem, the wiring of the clock signals, which is in the same form of the wiring of the C/A signals, is wired from the Phase Locked Loop (PLL) circuit to the farthest DRAM, and is folded, and then is terminated in the vicinity of the PLL. With respect to the clock signals that are the folded wiring, the clock signal input terminals that the DRAMs have with respect to the wiring before the folding and that after the folding are connected at respective one location. From these two input clock signals, signals having a intermediate phase of the two clock signals are generated within the DRAMs, and the internal signals are used for the data signals.

By using the first means to solve the above first problem, the DRAM is such that the clock timing adjustment circuit allows the DRAMs to adjust the clock signal timing by the delay time due to wiring-lenght difference between the clock signals and the C/A signals, thereby latching the C/A signals by the clock signals having the adjusted timing.

Also, by using the second means to solve the first problem, the DRAM is such that the C/A signal timing adjustment circuit allows the DRAMs to adjust the C/A signal timing by a delay time due to the wiring-length difference between the clock signals and the C/A signals, thereby latching the C/A signals having the adjusted timing by the clock signals.

By using the first means to solve the second problem, the time difference between the C/A signals and the second clock signals is almost eliminated, and the DRAMs can latch the C/A signals by the second clock signals.

Further, by using the second means to solve the second problem, each DRAM refers to and takes in the input clock signals provided before the folding from the PLL. Then, since the delay time of the register provided to be distributed to the DRAMs on the DIMMs is incorporated into a feedback loop of the PLL, both are cancelled. For this reason, the C/A signals can be taken in by the folded wiring of the PLL.

DESCRIPTION OF THE PREFERRED EMBODIMENTS

First Embodiment

Figure 1:
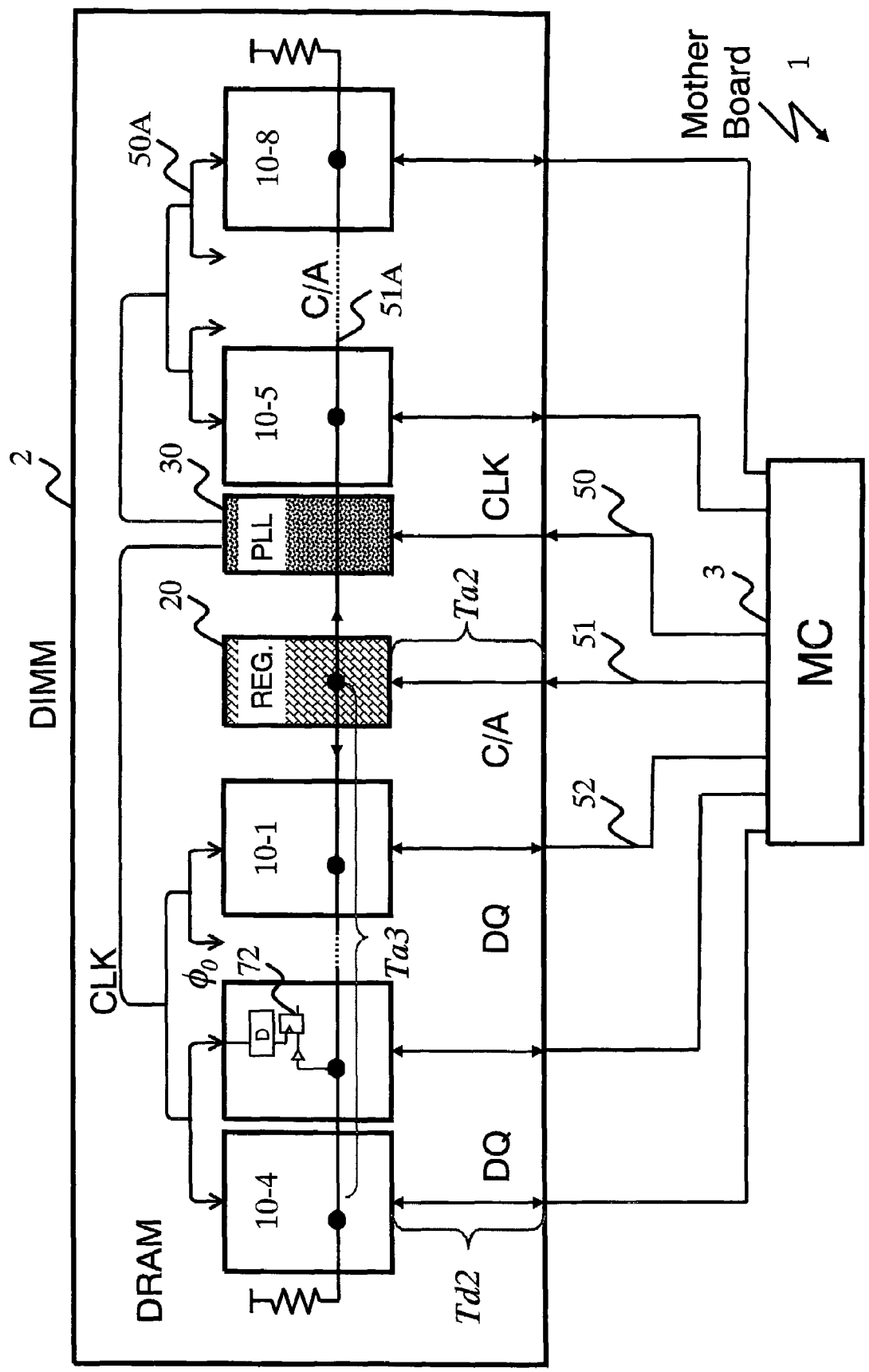
FIG. 1 is a view for explaining a memory module according to a first embodiment of the present invention.
Figure 2:
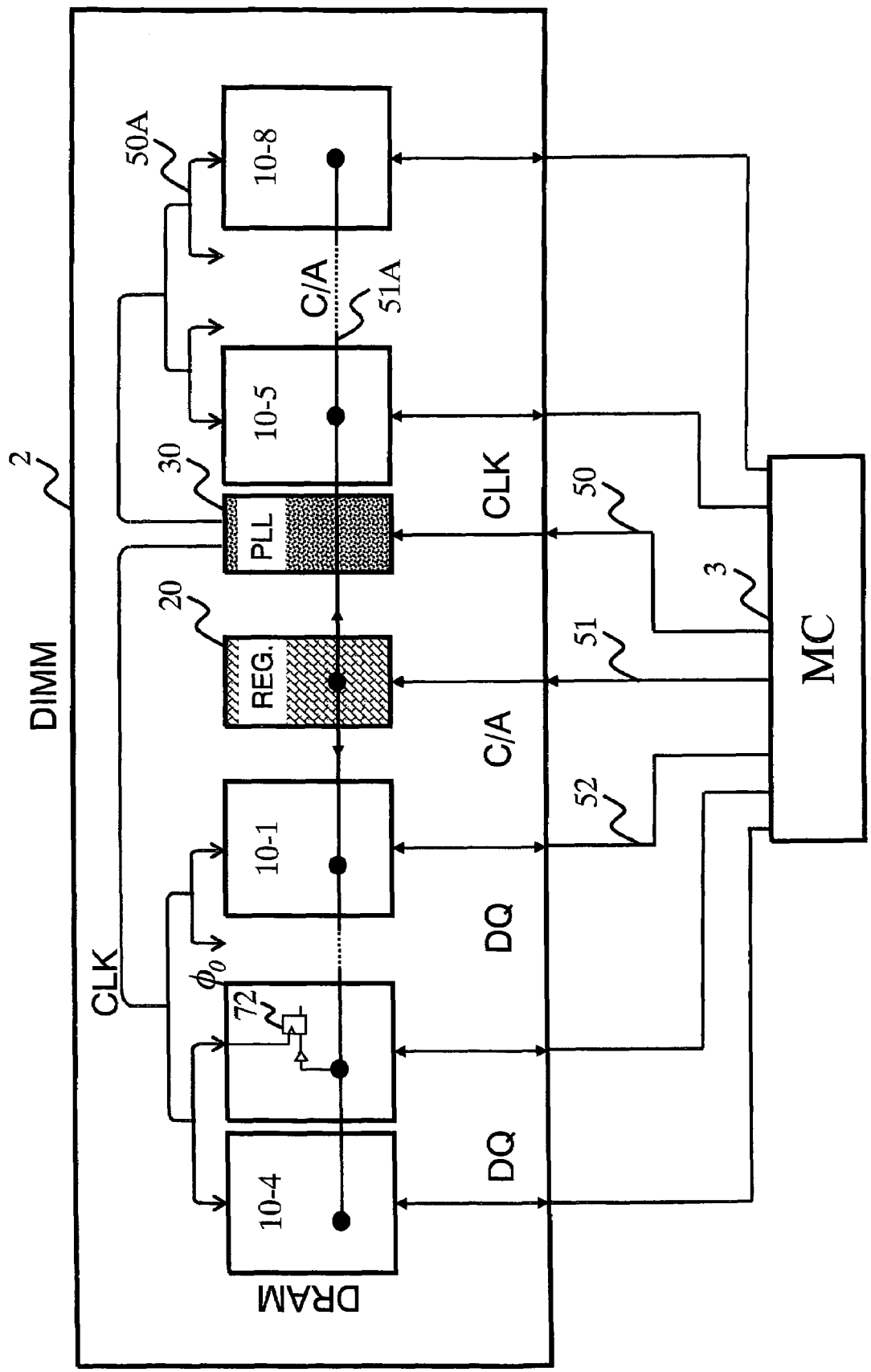
FIG. 2 is a view for explaining a conventional memory module.

A first embodiment will be described with reference to FIG. 1.

The reference numerals "10-1" to "10-8" denote DRAMs mounted on a DIMM 2. In addition to the DRAMs 10-1 to 10-8, the DIMM 2 incorporates a C/A register 20 (hereafter abbreviated as "register") for command/address signals and a clock signal stabilizing circuit (hereafter abbreviated as "PLL") 30.

A memory controller (hereafter abbreviated as "MC") 3 executes control of reading and writing of signals to the DRAMs 10-1 to 10-8, and is mounted on a print circuit board (hereafter abbreviated as "motherboard") 1. To the respective DRAMs 10-1 to 10-8 from the MC 3, terminals on which the DIMM 2 is mounted are connected through wirings on the motherboard 1.

A C/A signal 51 is transmitted from the MC 3 to a register 20 mounted on the DIMM 2, and connected from the register 20 to each of the DRAMs 10-1 to 10-8 on the DIMM 2. The reference numeral "51A" denotes a signal within the DIMM 2. In FIG. 1, the register 20 is located in the center of the aligning DRAMs 10-1 to 10-8, and connected to a C/A signal terminal of each of the DRAMs 10-1 to 10-8.

An output of a PLL 30 is wired to each of the DRAMs 10-1 to 10-8 so as to have the equal length from the PLL 30 and so that the respective DRAMs 10-1 to 10-8 can operate in synchronization with one another. Wirings in FIG. 1 are formed in a tree shape and the clock signals 50 arrive in phase if being viewed from the PLL 30. Hereinafter, the phase of the clock signal 50 that has reached the DRAM is called "$\phi 0$" (phi zero). The clock signal 50 may be supplied from the MC 3 or from any other components.

Next, timing of DQ signals 52 and C/A signals 51 will be described by using FIG. 3 for describing a transaction of write data from the MC 3.

The clock signal 50 and the DQ signal 52 outputted from the MC 3 are inputted into the DIMM 2 with a phase interval between them being maintained the same. Then, a relation of their phase time difference remains unchanged even if those phases may be zero or may not be zero. In this case, the phase of each signal is defined as a time difference from a rising or falling state of the clock signal 50 to a state of each signal.

The clock signals 50 are inputted into the PLL 30 and reach the respective DRAMs as the clock signals 50A, and the DQ signals 52 reach the respective DRAMs from the terminals of the DIMM 2 after a delay time due to wirings disposed on the DRAMs. The DQ signal having a propagation delay time from the MC to each DRAM is given by:

$$Td = Td1 + Td2 \quad (1)$$

where "Td1" is a wiring delay time on the motherboard 1 and equal-length wirings are adopted so as to have the same length with respect to all the DQ signals. "Td2" is a line delay time from an electrode of the DIMM to the terminal of each DRAM, and also the equal-length wiring is adopted from the electrode to the terminal. Therefore, there is no skew greater than design and manufacture fluctuations among the DQ signals 52.

Next, the propagation delay time TC/A(i) of the C/A signals 51 from the MC to each DRAM is given by:

$$TC/A(i) = Ta1 + Ta2 + Treg + Ta3(i) \quad (2)$$

where "Ta1" is a wiring delay time of the C/A signals 51 on the motherboard 1 and equal-length wirings are adopted so as to have the same length from the MC 3 to the DIMM 2 with respect to all the C/A signals 51. "Ta2" is a delay time from the electrode of the DIMM 2 to the terminal of the register 20, and the equal-length wirings are similarly adopted so as to have the same length from the electrode to the terminal. "Treg" is a delay time from an input of the register 20 to an output thereof. Therefore, "Ta3(i)" means the wiring delay time of the C/A signals 51A to an i-th DRAM from the register 20.

By using the above expressions (1) and (2), the time difference (phase difference) between times when the DQ signals 52 and the C/A signals 51 outputted from the MC 3 reach each of the DRAMs 10-1 to 10-8 can be calculated by the following expression:

$$TC/A(i) - Td = Treg + Ta3(i) \quad (3)$$

where it is assumed that the DQ signals 52 and the C/A signals 51 on the motherboard are wired to have the equal delay time. This is represented by the expressions:

$$Td1 = Ta1 \quad (4)$$

$$Td2 = Ta2 \quad (5)$$

The expression (3) shows that, in addition to the fixed delay time of the register 20 (Treg), a phase difference corresponding to the wiring length of the Ta3(i) is generated. In the case of the wirings as shown in FIG. 1, the phase delay time difference is such that the maximum gap of "Ta3(4)−Ta3(1)" occurs among the DRAMs 10-1 to 10-8 and if an interval between the DRAM 10-1 and the DRAM 10-8 is "δL=50 mm", the expression $$\delta T = \delta L / Vp \quad (6)$$

is used to obtain "δT=833 ps". In this case, the propagation delay speed (Vp) is set at 60 mm/ns because delay is generated due to inputted capacity components.

In the case of the DRAM in a DDR-SDRAM method, the C/A signals 51 operate at a half of the DQ signals 52. When the DQ signals 52 operate at 1.6 Gpbs, the C/A signals 52 operate at 0.8 Gbps. In such a case, time width of the C/A signals 51 is 1250 ps. In contrast, the above δT corresponds to 66% thereof, thus exceeding the half. In order to accurately take the C/A signals 51A in the DRAM, they are preferably taken at the time position which is at the half of time width of the C/A signals 51A because timing margins thereof are wider. However, the above δT exceeds the half of the time width. Therefore, taking the data has been unstable. Hence, in this embodiment, as shown in FIG. 3, the C/A signals are taken in each DRAM by using delay time elements.

Figure 4:
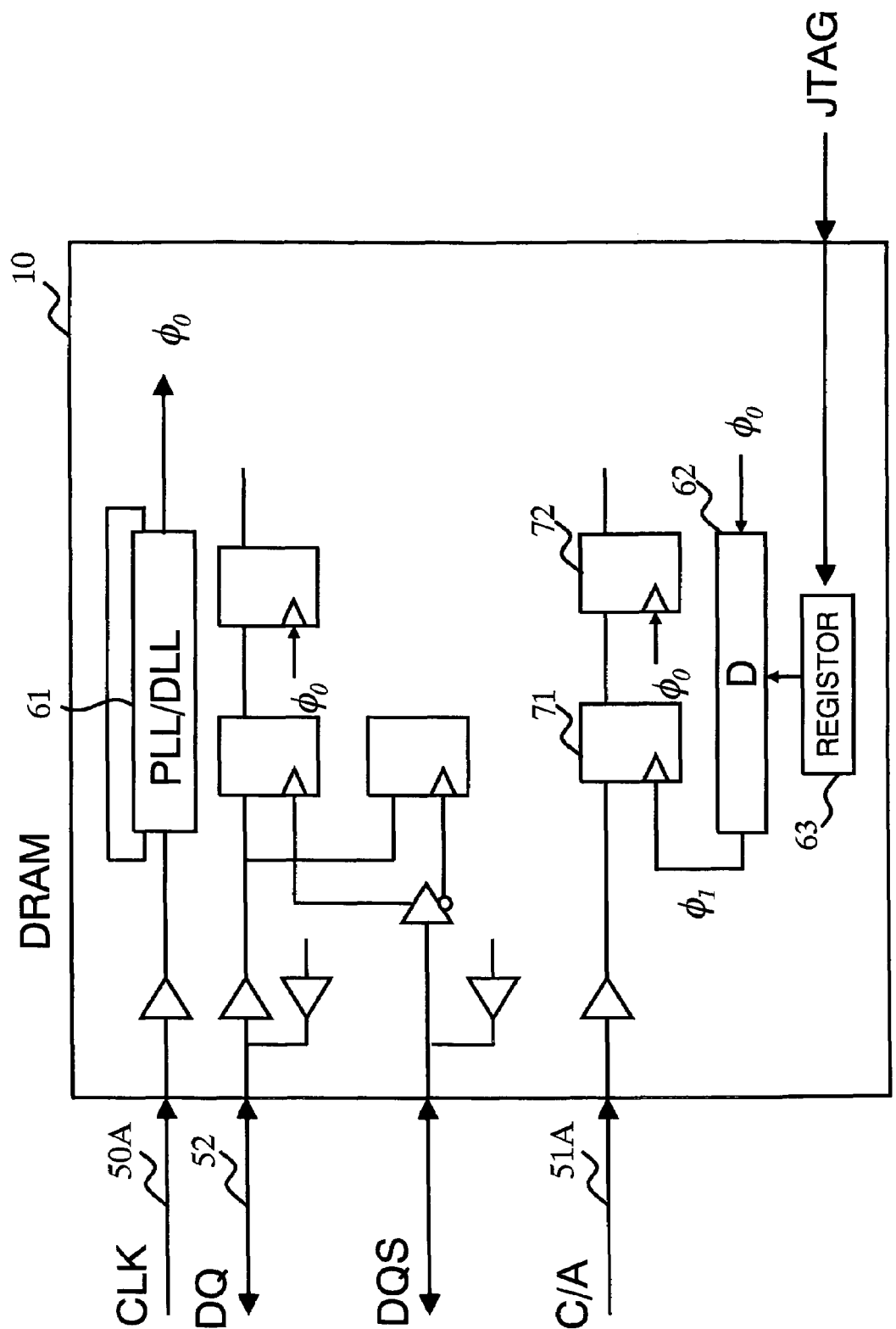
FIG. 4 is a view for explaining a internal circuit of a DRAM in a first embodiment of the invention.

A method of implementing this will be described with reference to FIG. 4.

The clock signals 50A generates a phase $\phi 0$ synchronized in phase with the clock signals 50A by using a clock adjustment circuit (PLL) 61 provided in the DRAM 10. The reference numeral "62" denotes a variable delay circuit, as well as a delay circuit that generates a phase $\phi 1$ having a constant phase difference with respect to an input of the clock signal phase $\phi 0$. Quantitative Setting of a delay amount (D) of the variable delay circuit 62 is given by the following expression:

$$D = MOD(Treg + Ta3(i) + \tfrac{1}{2} Tcycle, Tcycle) \quad (7)$$

where "Tcycle" is a cycle of the C/A signal and "MOD" is a remainder function. The expression (7) gives a remainder of a second term Tcycle to a first term in the MOD function. Therefore, it is understood that, by the phase $\phi 1$ having the delay amount (D) in the delay circuit 62, the C/A signal 51A is latched by a flip flop (hereafter abbreviated as "FF") 71 and the DRAM 10 can incorporate the C/A signals. To the contrary, it is understood that even if the variable delay circuit is provided to the C/A signals and a phase difference between the phases $\phi 0$ of the C/A signals and the clock signals is set as the delay amount (D), the DRAM 10 can incorporate the C/A signals.

Here, the delay amount (D) may be determined by calculating the expression (6) using the wiring-length difference or by actual measurement.

The DIMM 2 mounts the DRAMs 10-1 to 10-8 and is shipped after passing an inspection. Thus, a manufacturer that ships the DIMM 2 has information on how much each of the DRAMs 10-1 to 10-8 is delayed on the DIMM 2. The information amount needs only to be written in the DRAMs 10-1 to 10-8 before shipment.

The write of the information (D) needs only to be held by a register 63 provided in the DRAM 10. In order to write data into the register 63, the data is stored in a storage element other than the DRAM provided on the DIMM, and may be written into the register 10 in the DRAM 63 through an interface for boundary scan testing such as JTAG 55. Thereby, separate pins for writing become unnecessary.

The "JTAG" herein is a standard method of the boundary scan testing, which is one of methods of inspecting IC chips, and is a name of an industry group that has defined the standards. The JTAG standards have been standardized by the Institute of Electrical and Electronics Engineers (IEEE) in 1990 as IEEE std. 1149.1-1990 "Standard Test Access Port and Boundary-SC/An Architecture".

Here, as another embodiment, there is also a method of forming, into a tree-shaped structure similar to that of the clock signals 50A, the C/A signals 51A in the DIMM 2 and wiring them on the respective DRAMs 10-1 to 10-8 so as to have the same timing. In such a case, although the phase adjustment delay circuit as shown in FIG. 4 becomes unnecessary, the C/A signals in the DIMM 2 have approximately 20 bits. Therefore, if wirings are formed into a tree shape, an area occupied by the wirings is larger and the size of the circuit board in the DIMM 2 or the number of layers of the circuit board becomes necessary more, whereby low costs thereof cannot be achieved.

In contrast, the present embodiment has the effect of making small the area occupied by the wirings and reducing the manufacturing costs of the circuit boards by linearly wiring the C/A signals from the register 20 to the respective DRAMs 10-1 to 10-8.

In addition, in FIG. 1, if the MC 3 in FIG. 1 outputs the DQ signals 52 and C/A signals 51 in synchronization with the clock signals 50, the clock signals 50A and the DQ signals 52 can simultaneously reach each of the DRAMs 10-1 to 10-8. This is because, by using the basic function of the PLL 30, the clock signals can apparently be distributed without any delay.

When seen from the MC 3, this point means that the C/A signals 51 with respect to all the DRAMs 10-1 to 10-8 is written to the farthest DRAM 10-4 from the register 20 irrespective of different locations and/or wiring lengths. As described earlier, this is executed since the delay function operates so that the phase adjustment delay circuits 62 in the DRAMs 10-1 to 10-8 cancel the wiring-length difference. This delay is written by using the boundary scan signals. Therefore, the DIMM 2 can be constructed by only one type of DRAM even if the DRAM has two or more than delay time amounts.

Figure 5:
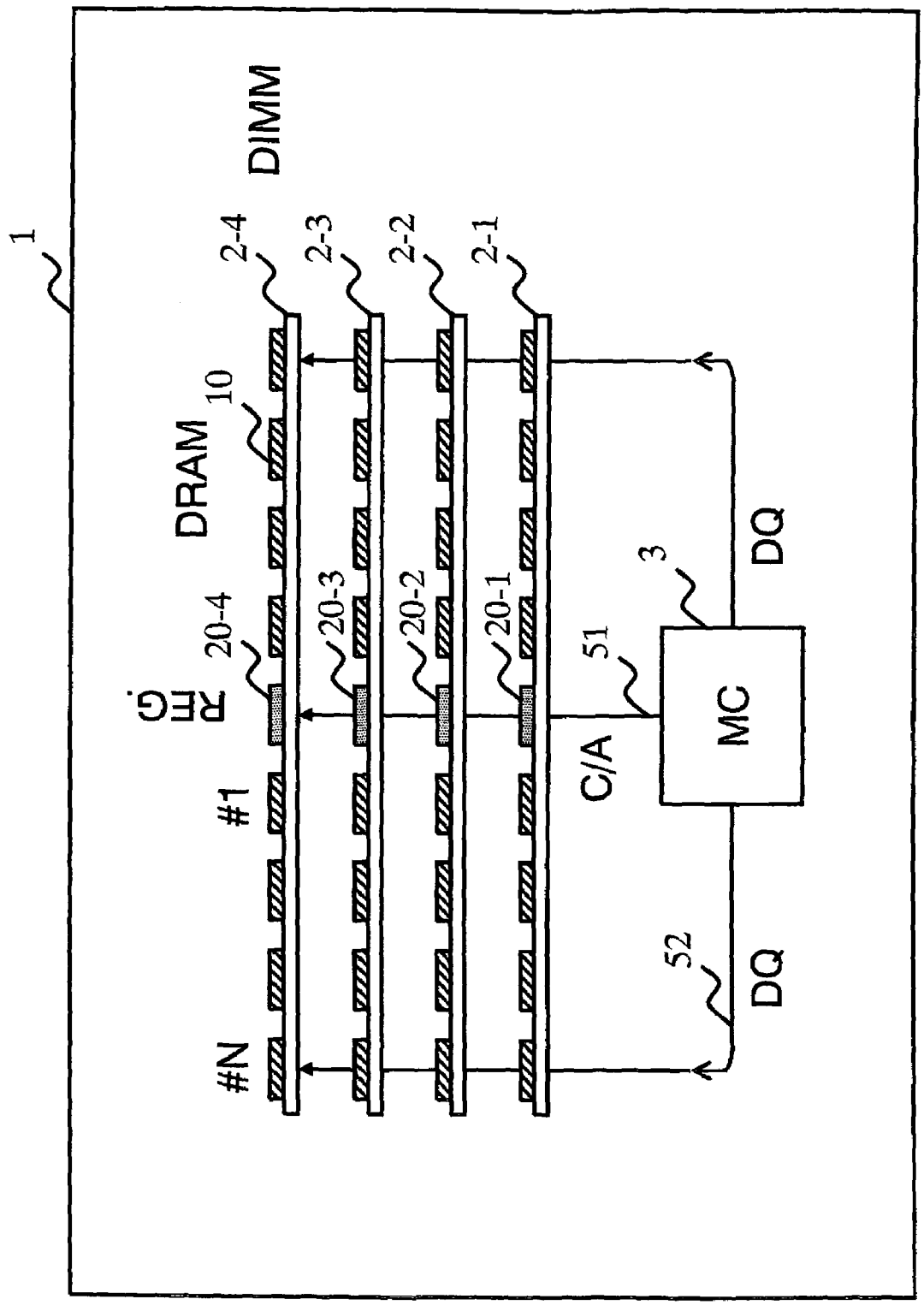
FIG. 5 is a view for explaining a motherboard in a first embodiment of the present invention.

Next, with reference to FIG. 5, mounting of the motherboard in the first embodiment will be shown. This embodiment also has the same effect as those of memory modules of a second and third embodiments described later.

FIG. 5 is a top plan of the motherboard 1, wherein the DQ signals 52 drawn from the MC 3 and the C/A signals 51 are bus-connected to respective terminals of the DIMMs 2-1 to 2-4. Then, registers 20-1 to 20-4 are respectively mounted on respective DIMMs 2-1 to 2-4, and are wired to the DRAMs incorporated in the respective DIMMs 2-1 to 2-4, as shown in FIG. 1. Thus, with respect to the DIMM 2-1, the timing of read operation/write operation from/to the farthest DRAM in the same DIMM 2-1 is specified for the register 20-1.

Similarly, also with respect to the DIMMs 2-2 to 2-4, the timing to the farthest DRAM in said DIMM is specified. Thus, when seen from the MC 3, the DIMMs 2-1 to 2-4 differ only in the delay time of the wirings disposed on the motherboard 1. That is, there is the effect that design thereof is easily achieved by considering only the wiring delay time due to a difference among the DRAM positions in the access timing to each DRAM in each of the DIMMs 2-1 to 2-4.

The wirings of the DQ signals 52 and the C/A signals 51 may be formed using a crosstalk technique or using a wiring technique called STL (Stub Series Termination Logic) or using combination of both. The important point is that both of the DQ signals and the C/A signals can reach each DRAM within an equal time period when seen from the MC 3. As long as any interface satisfies this condition, it can essentially have almost the same effect as that of this embodiment.

Similarly, in the inspection of the DIMM, since all of the DQ signals 52 and the C/A signals 51 are specified to the clock signals 50, there is the effect that the inspection by the tester can be easily made. If the DRAMs have different timing depending on a place on which the DIMM 2 is mounted, the inspection by the tester needs to adjust the timing per DRAM and, thus, many test vectors for inspection must be prepared accordingly. In addition, since a long time is required for the inspection, production efficiency thereof is reduced. However, in this case, there is also the effect of avoiding such drawbacks.

As described above, according to the present embodiment, since the C/A signals are linearly wired from the register 20 to each of the DRAMs 10-1 to 10-8, there are the effects of reducing the areas occupied by the wirings and lowering the costs of the circuit board.

In addition, if the signals are linearly wired as described above, the phase difference between the C/A signals and the data signals is shown by the expression (3). However, even in such a case, since the phase difference between the C/A signals and the data signals can be eliminated by delaying the C/A signals, the C/A signals can be taken in. Consequently, it is possible to access all of the DRAMs in the DIMM with the same timing, so that there is the effect that the testing of the DRAMs as well as timing design of the memory system can be easily made.

Second Embodiment

Figure 6:
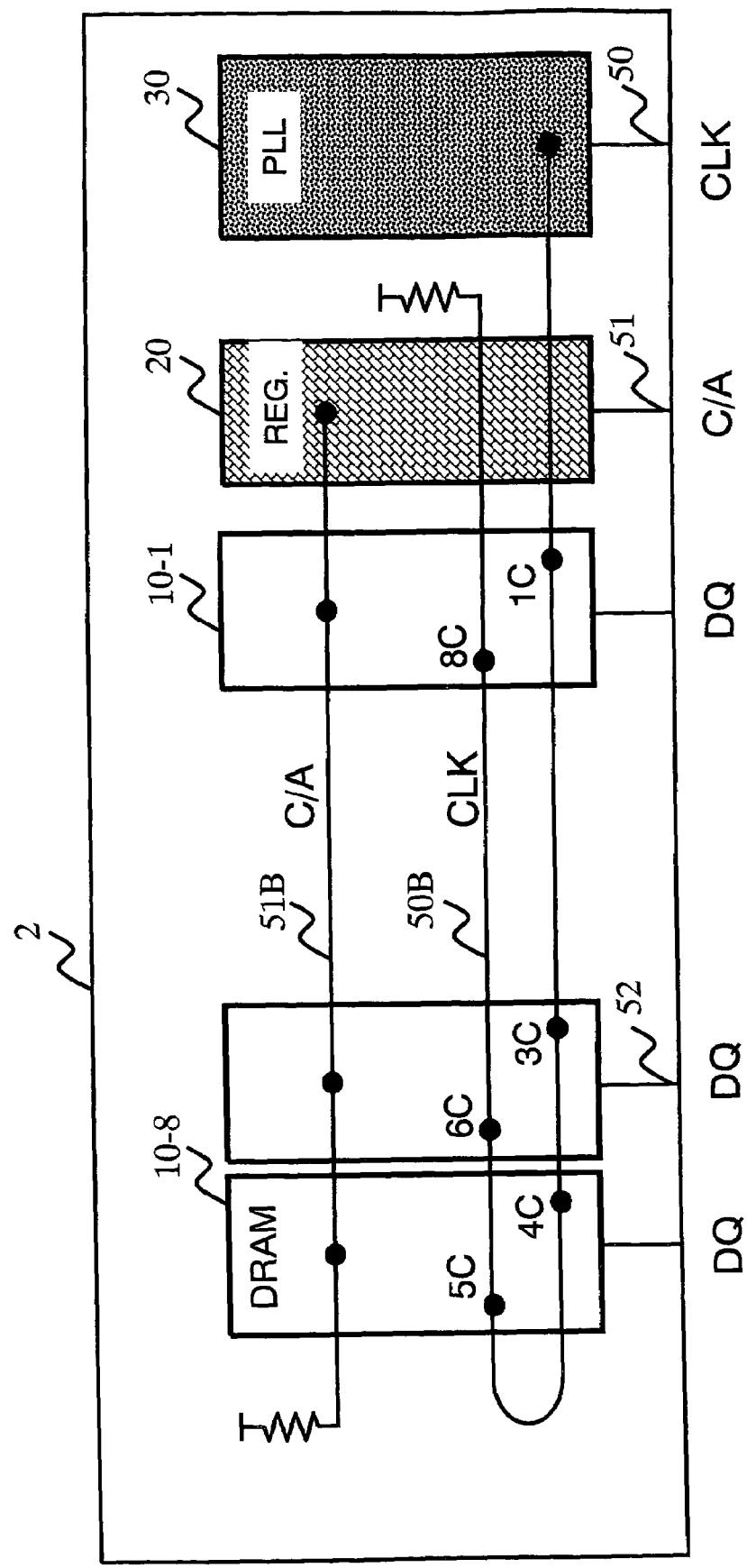
FIG. 6 is a view for explaining a memory module according to a second embodiment of the present invention.

With reference to FIG. 6 a second embodiment will be described.

The present embodiment is characterized in that the same line is used for a clock for receiving the C/A signals and for a clock distributed to each DRAM.

On the DIMM 2, the DRAMs 10-1 to 10-8, the register 20, and the PLL 30 are mounted. The register 20 and the PLL 30 are located at an end of the DIMM 2. Then, C/A signals 51B in the DIMM 2 are wired into a daisy-chain shape. Also for clock signals 50B, a folded wiring from the PLL 30 is used, and clock-input terminals of the DRAMs 10-1 to 10-8 are respectively connected to the wiring before folding and that after folding. In addition, as a far end of the wiring of the clock signals 50B is a matching end, there is no reflection at this part.

Figure 7:
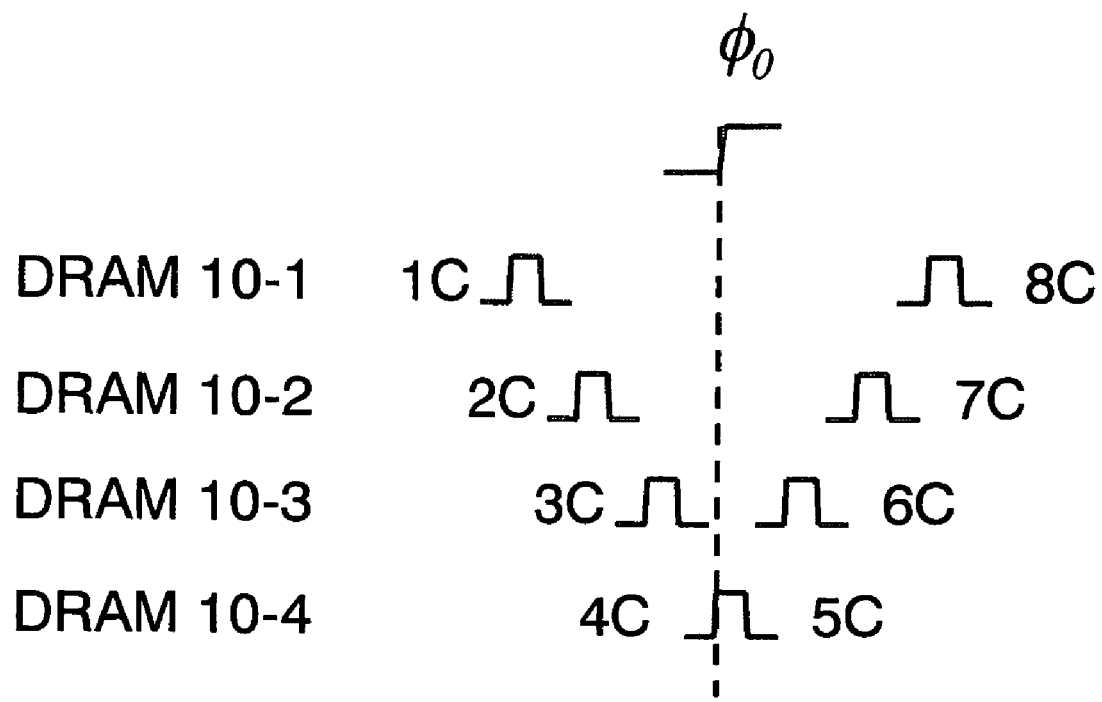
FIG. 7 is a view for explaining timing in a second embodiment of the present invention.

In order to adopt this configuration, two clock signals having a different phase in accordance with a wiring-length difference are inputted to the DRAMs 10-1 to 10-8. If terminals are denoted by the reference numerals "1C, 2C, 3C, . . . , 8C" for convenience in short order of signal arrival times when the signals from the PLL 30 arrive to each of the DRAMs 10-1 to 10-8, one pulse as shown in FIG. 7 reach the respective terminals. The horizontal axis of FIG. 7 indicates time and illustrates propagation of a single pulse.

In the DRAM 10-1, the fastest pulse is inputted to the terminal 1C and the slowest pulse is inputted to the terminal 8C. Similarly, in the DRAM 10-2, the second fastest pulse is inputted to the terminal 2C and the second slowest pulse is inputted to the terminal 7C. The phase difference among these pulses depends on the wiring-length difference of the clock signals 50B. The difference is the same delay time difference when seen from the folding point, and the clock signals arrive earlier at the terminals 1C to 4C and arrive later at the terminals 5C to 8C. Thus, the intermediate time of the time difference between the two pulses to be inputted from the two clock terminals of the DRAM is equal to an arrival time of the pulse in the folded portion. The phase of the clock signals 50B at this folded portion will be represented as "φ0".

Figure 8:
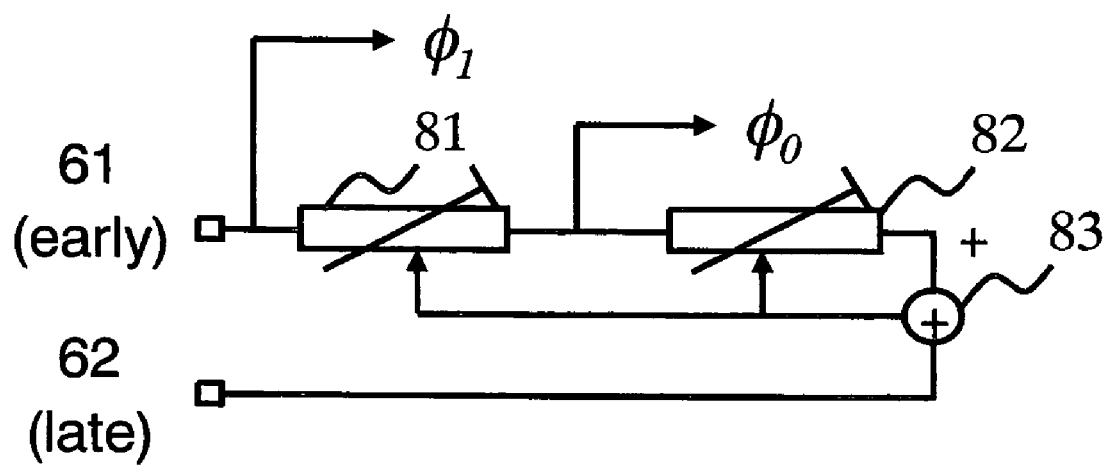
FIG. 8 is a view for explaining a clock circuit according to a second embodiment of the present invention.

By the circuit shown in FIG. 8, the DRAMs 10-1 to 10-4 generate clocks, each of which has a phase of clock φ0. In FIG. 8, the reference numerals "61" and "62" denote input terminals for clock, and the clock signals having the phase difference are inputted. The reference numerals "81" and "82" denote variable delay circuits and each of them has the same delay time. The reference numeral "83" denotes a phase comparator that determines which of two inputs has a fast or slow phase and that feeds back the control signals to the delay circuits 81 and 82 in accordance with the determination result.

By adopting the above-mentioned configuration, a time obtained by adding the delay circuits 81 and 82 is equal to a time difference that is the phase difference between the input terminals 61 and 62. Then, since the delay times of the delay circuits 81 and 82 is the same, a phase of φ0 has half of the delay time. That is, this means that there can be generated the clock φ0 suitable for the half time of the phase difference between the clocks inputted to the input terminals 61 and 62 and thereby the same clock as that of the phase of φ0 in FIG. 4 is given.

The clock signals 50 inputted to the DIMM 2 are distributed to each of the DRAMs 10-1 to 10-8 to have the same delay time as that of the register 20. This is achieved by using a configuration shown in FIG. 9. At the register 20 on the DIMM 2, the C/A signals 51 are converted into the C/A signals 51B that are in phases. However, the PLL 30 is converted into the clock signal 50B so that the delay time Treg, which the register 20 has, can be cancelled. In other words, the PLL 30 operates so that both phases become equal to each other, but one of these two inputs is connected to the input clock signals 50 and the other input is inputted to the signal of the output 50B of the PLL 30 that has the same delay as "Treg".

At this time, the delay of "Treg" can be obtained by making the clock signals 50B pass through the internal circuit of the register 20. A passage time through the register 20 has the same value as that of the delay time from the C/A signals 51 of the register 20 to the C/A signals 51B. According to this configuration, since the delay time (Treg) of the register 20 that varies depending on process fluctuations and/or variation in temperatures or voltages can be changed with the same fluctuation margin, the configuration can easily adapt to these variations. Note that, in FIG. 9, although the register 20 and the PLL 30 are configured in respective separated circuits, they may be configured in the same circuit.

In addition, although the C/A signals 51 in the register 20 are synchronized with the clock by the latch circuit provided in the register 20, it is unnecessary to provide the latch circuit if the variations are permitted by the system. In this case, since there is no functional distinction between the path for clock delay and the path for the C/A signals 51, the register 20 may simply be a bus buffer.

Figure 9:
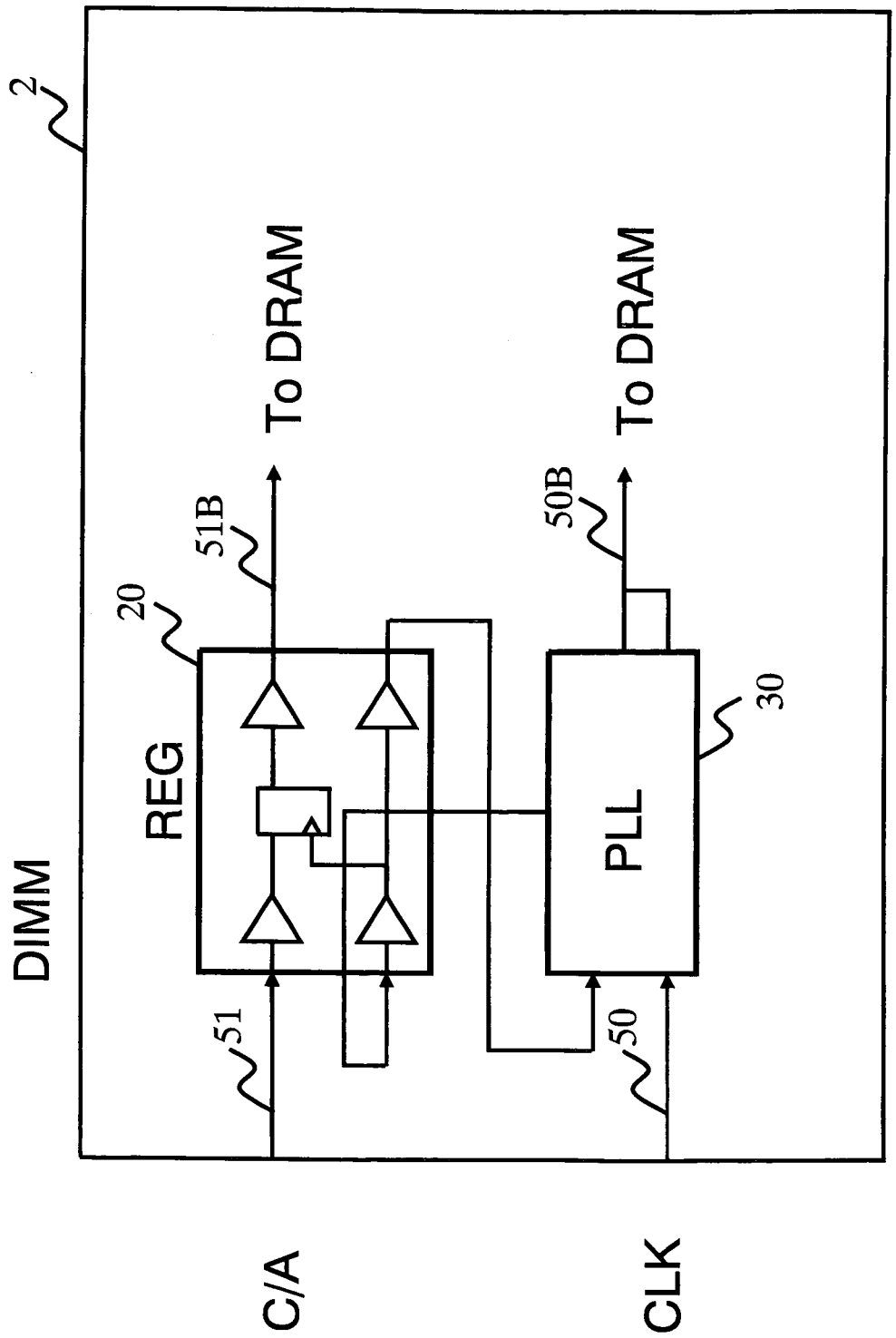
FIG. 9 is a view for explaining a clock generating circuit that cancels delay time of a register in a second embodiment of the invention.

As shown in FIG. 9, when the clock signal 50 is controlled, the clock phases of the DRAMs 10-1 to 10-8 in FIG. 6 are all equal to the time when the C/A signals 51B arrive at the farthest DRAM 10-8 with respect to the register 20. For this reason, since all the DRAMs 10-1 to 10-8 can be set so as to operate in phase in the DIMM 2, the timing can be specified by the terminals of the DIMM similarly to the first embodiment. Thereby, this configuration has the effect of designability and testability.

By wiring the clock signals 50B as shown in FIG. 6 and using the circuits as shown in FIGS. 8 and 9, a common clock φ0 can be generated in the DRAMs 10-1 to 10-4 without the tree-shaped wirings. Also, in FIG. 8, although the clock signal having a fast phase (φ1) is inputted to the terminal 61, this phase is identical to the signal delay time of the C/A signal 51B from the register 20. This is because the wiring length from the register 20 to each of the DRAMs 10-1 to 10-4 is almost the same as the wiring length from the PLL 30 to said DRAMs 10-1 to 10-4. Consequently, use of the clock signals inputted to the terminal 61 makes it possible to take in the C/A signals 51B because the delay time from the same register 20 and PLL 30 to each of the DRAMs 10-1 to 10-8 is equal.

The present embodiment has the following differences and effects in comparison with the conventional Patent Documents 1 and 2. An intermediate phase is generated from the two phase differences by using the folded wiring in the conventional technique. However, further in the present embodiment, adjustment is made to match the timing phase of the clock signals 50B with the C/A signals 51B by using feedback of the PLL 30 of the DIMM 2, as shown in FIG. 6. Thereby, this configuration has the effect that the variations of the delay "Treg" of the register 20 can be absorbed by the circuit shown in FIG. 9.

Figure 3:
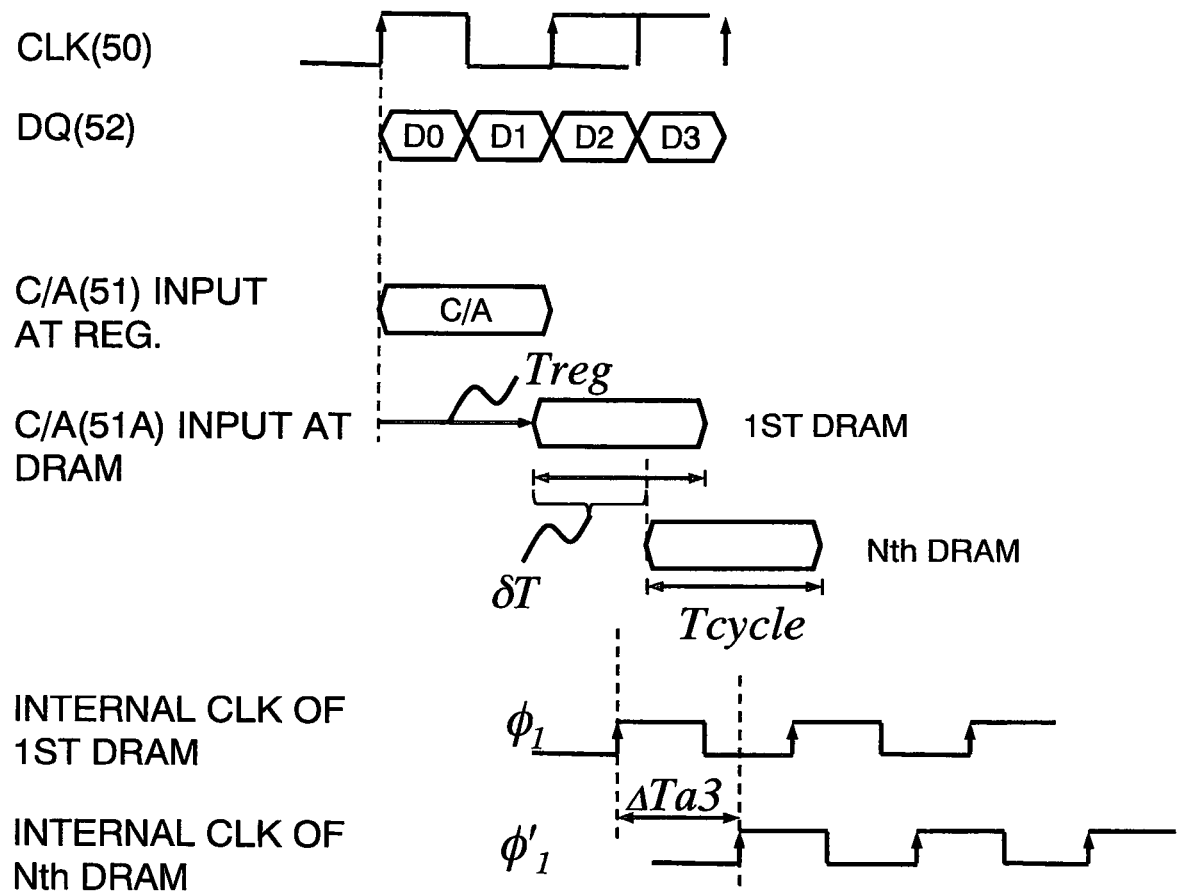
FIG. 3 is a view for explaining timing in a first embodiment of the present invention.

By adoption such a configuration, it is possible to generate the common clock φ0, without using the delay time φ1 by the delay circuit in the DRAM of FIG. 3 shown in the first embodiment. Thus, the delay circuits 62, the register 63, and the write circuit using the boundary scan, which are shown in FIG. 4, become unnecessary. Consequently, since the circuits can be simplified and the chips can be reduced in size, the costs can be reduced. Also, since the area occupied by the wirings on the DIMM of the clock is reduced, the area of the DIMM can also be made small and the lower costs can be achieved.

Third Embodiment

Figure 10:
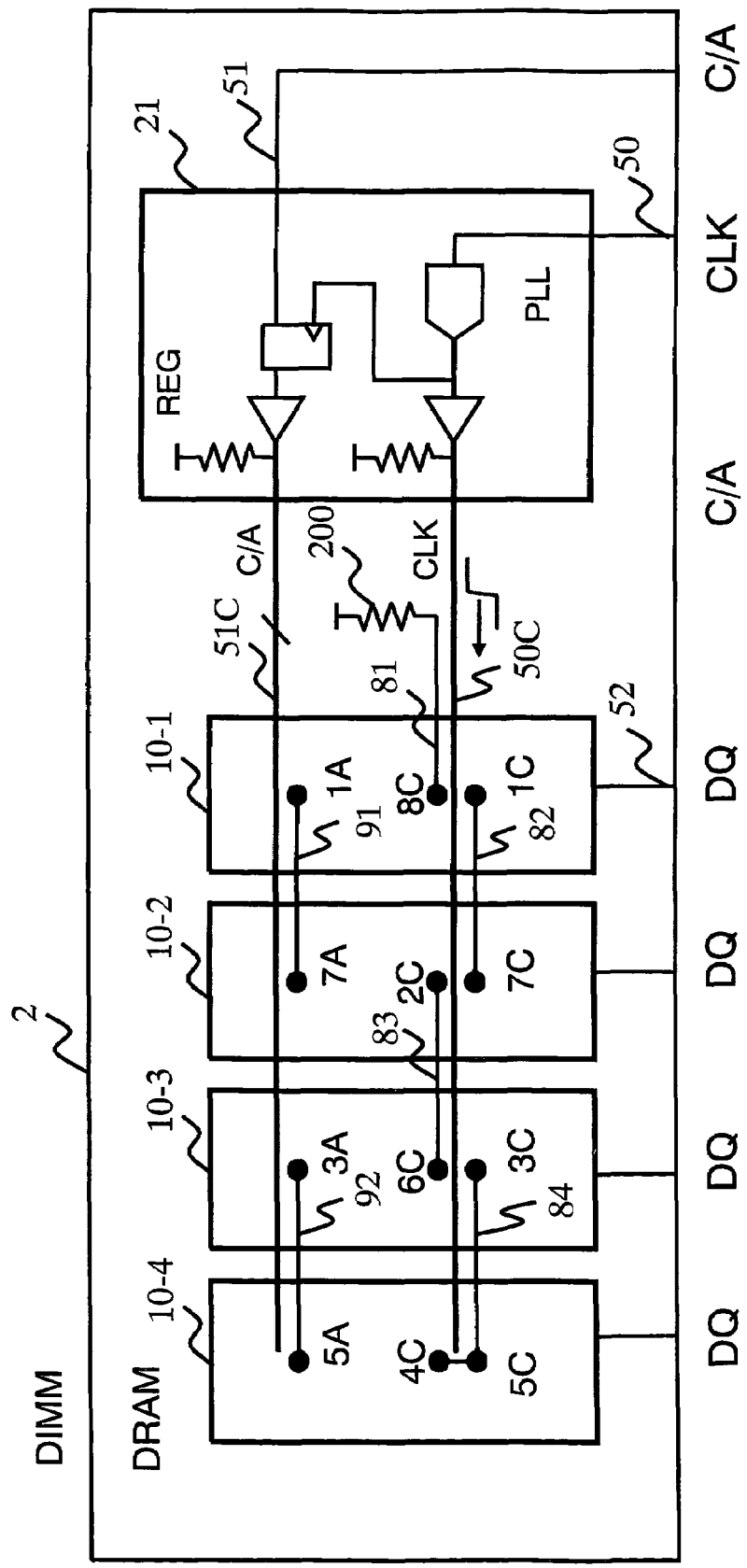
FIG. 10 is a view for explaining a memory module according to a third embodiment of the present invention.

A third embodiment will be described with reference to FIG. 10.

The present invention is an example in which the clock signals 50B in the second embodiment are constituted by a directional coupler. FIG. 10 shows only the clock signals and the C/A signals, and other signals are the same as those in the second embodiment. In this embodiment, the clock signals are denoted by the reference numeral "50C". In addition, although four DRAMs is used to simply describe this embodiment, the same effects can be achieved irrespective of whether the number of the DRAMs is smaller or greater. One wiring for the clock signals 50 is drawn from the PLL in (register+PLL) 21, and a far end of the above wiring is an open end. Thus, the clock signals 50C outputted from the PLL are totally reflected at the far end. The totally reflected pulses are absorbed by the termination resistor provided in the PLL and are not reflected again.

By using, as a primary coupling wiring, the wiring of the clock signals 50C drawn from the PLL 20, secondary coupling wirings 81 to 84 are wired to the DRAMs 10-1 to 10-4 so as to form a directional coupler. The secondary coupling wiring 82 is shared by and connected to the DRAMs 10-1 and 10-2. Input impedance of the clock signals 50C of the DRAMs 10-1 to 10-4 matches characteristic impedance of wiring, and the above clock signals are not reflected at the respective terminals thereof. The DRAM 10-1 is connected to one end of the secondary coupling wiring 81, and the other end of the secondary coupling wiring 81 has a matching end by the resistor 200. In addition, two ends of the DRAM 10-4 are connected to one end of the secondary coupling wiring 84.

The secondary coupling wirings 81 to 84 constituting a directional coupler generate crosstalk signals backward with respect to pulses running on the wiring of the clock signals 50C that are the primary coupling wiring. In this case, the term "backward" means such a direction as to proceed in an opposite direction to a propagating direction of the pulses on the primary coupling wiring. Thus, in the clock signals 50C outputted from the PLL, the backward crosstalk signals are inputted to the respective terminals in order of 1 to 8 surrounding the clock signals 50C in FIG. 10.

Although the signal pulses outputted from the PLL 20 first pass through the wiring of the clock signals 50C coupled to the secondary coupling wiring 81, backward crosstalk is generated in this directional coupler. This only propagates to the termination resistor 200, and has no influence on an operation of the DRAM 10-1.

Next, the pulses of the clock signals 50C outputted from the PLL 20 pass through a wiring portion coupled to the secondary coupling wiring 82. Then, the backward crosstalk generated by the terminal 1C connected to the DRAM 10-1 is inputted to the secondary coupling wiring 82. Since the input impedance of the terminal 1C of this DRAM 10-1 has the matching end within the DRAMs, it is equal to the wiring impedance and is not reflected at this portion. Consequently, no pulse is then transmitted to the DRAM 10-2 connected to the wiring 82.

Similarly, the pulses that proceed on the wiring of the clock signals 50C apply the generated backward crosstalk to a terminal 2C of the DRAM 10-2 with respect to the secondary coupling wiring 83. Further, the pulses of the clock signals 50C first apply the backward crosstalk to a terminal 3C of the DRAM 10-3 with respect to the secondary coupling wiring 84. The pulses proceeding on the wiring of the clock signals 50C are totally reflected since the far end is an open end, and so they change the direction of movement. Although the reflection pulse proceeding in the right generates the backward crosstalk at the secondary coupling wiring 84, the pulses are inputted almost simultaneously to terminals 4C and 5C of the DRAM 10-4. Consequently, the pulses are incident on the two terminals in the DRAM 10-4 at the same time. This is equal to the phase of the clock signal φ0 of the folded portion of FIG. 6 in the second embodiment.

Although the pulses of the clock signals 50C reflect at a far end and proceeds toward the PLL, the input pulses are inputted to: a terminal 6C connected to the secondary coupling wiring 83; a terminal 8C connected to the directional coupler 82; and lastly the terminal 8C connected to the secondary coupling wiring 81. In addition, reflected waves returned to the PLL are absorbed by the termination resistor in the PLL and thus are not reflected at the termination resistor.

By absorbing such a configuration, the same effects as those of the second Embodiment can be obtained. In other words, the clock signals 50 is inputted to each of the DRAMs 10-1 to 10-8 through the direction coupler, as shown in FIG. 6. Then, the phase φ0 of the common time can be generated by generating an intermediate phase of the clock signals inputted to the two terminals.

Similarly, the C/A signals 51C outputted from the resistor in (register+PLL) 21 are wired into the same shape as those of the clock signals 50C. That is, one wiring whose far end is open is drawn from the terminated drivers, and the wiring constitutes the directional coupler and each of the DRAMs 10-1 to 10-4. The clock signals 50C are different from the C/A signal 51C in the secondary coupling wiring, and the secondary coupling wirings are simply wired between the DRAMs 10-1 and 10-2 and between the DRAMs 10-3 and 10-4. These terminals will be called "1A", "7A", "3A", and "5A" hereinafter. The numbers thereof are described in the same order as those of the clock signals 50C.

In other words, since the signal pulse timing of the C/A signals 51C is the same as that of the clock signals 50C. Thus, the C/A signals 51C inputted to each of the DRAMs 10-1 to 10-4 are the same as the clock signals 50C, and the pulses are inputted to: the terminal 1A with the same timing as that of the terminal 1C of the DRAM 10-1; next the terminal 3A with the same timing as that of the terminal 3C of the DRAM 10-3; further the terminal 5A with the same timing as that of the terminal 5C of the DRAM 10-4; and finally the terminal 7A with the same timing as that of the terminal 7C of the DRAM 10-2. Since the C/A signals 51C and the clock signals 50C are formed into the same wiring shape, the clock signals 50C can be used as a clock to take in the C/A signals 51C. By this configuration, the same effects as those of the second embodiment can be achieved. By this embodiment, since the respective wirings of the clock signals 51C and the C/A signals 51C can be simplified, there is the effect of realizing lower prices.

As described above, by applying the directional coupler and the reflected waves to the clock signals, the present embodiment can obtain two effects of reproducing the clock signals having the same phase and applying the reflected waves to a source clock for latching the C/A signals. Thereby, it is possible to provide simple structures at low price and perform high-speed operations.

Fourth Embodiment

A fourth embodiment of the present invention will be described with reference to FIGS. 11, 12, 13, 14, 15 and 16. Hereinafter, in some cases, respective terminals and/or signals and/or wirings are denoted by the same reference number, and further respective abbreviations of terminals and/or signals and/or wirings are denoted by the same reference numerals in some cases. (This will be applied also to a fifth and sixth embodiments).

Figure 11:
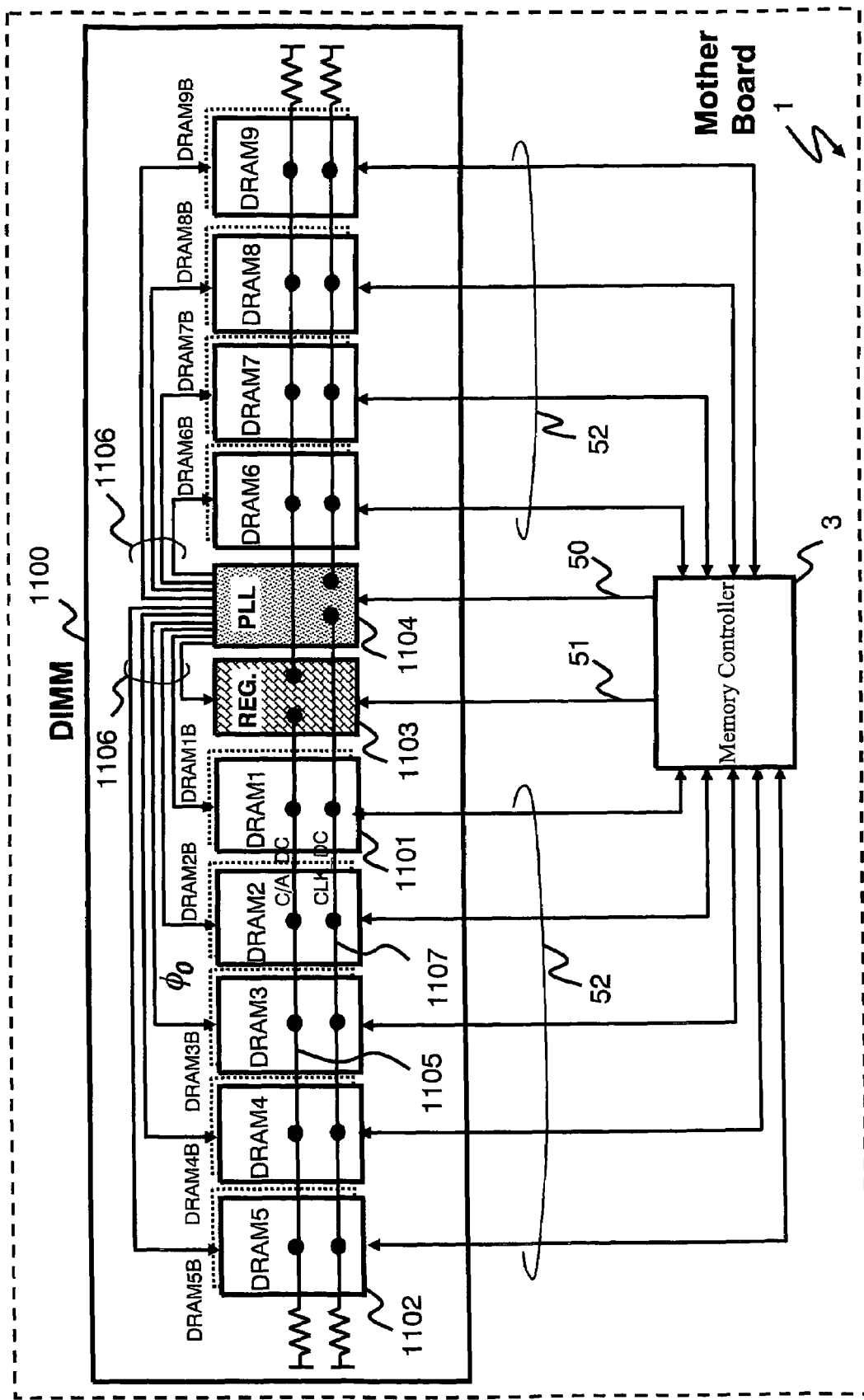
FIG. 11 is a view for explaining a memory module according to a fourth embodiment of the present invention.

FIG. 11 is a block diagram of a memory module 1100 of a fourth embodiment according to the present invention. Now, the memory module 1100 is a so-called "DIMM having two rank configuration in which×eighteen units of eight DRAMs are incorporated", wherein DRAMs 1 to 9 (1101), DRAMs 1B to 9B (1102), a register 1103, and a PLL 1104 are incorporated.

The ranks are divided into rank 1 including the DRAMs 1 to 9 and rank 2 including the DRAMs 1B to 9B. Here, the DRAMs 1B to 9B are those located on the back of the DRAMs 1 to 9, respectively. In a DRAM pair located on the front and back, for example, the DRAMs 1 and 1B that have the same functions, a data signal terminal, a command/address (C/A) signal terminal, and a clock signal terminal are electrically connected and share wirings. However, control signal terminals that become necessary per rank, such as chip selection signals (chip select) or clock-enable signals (clock enable), is excluded.

The data (DQ) signals 52 are connected to a data signal wiring group from the memory controller 3 on the motherboard to each DRAM on the memory module. All wirings of this data signal wiring group have the same length, and all data signals are outputted from the memory controller 3 with the same timing, and arrive at each DRAM with the same timing.

The C/A signals 51 are first transmitted from the memory controller 3 to the register 1103 on the memory module 1100 through a C/A wiring group. Then, from the register 1103, the C/A signals C/A_DC (also written as "C/A_DC signal" or "C/A_DC") are connected to the DRAMs 1 to DRAM 5 and the DRAMs 1B to 15B on the left side of the memory module by a daisy chain wiring 1105. Similarly, they are also connected to the DRAMs 6 to 9 and the DRAMs 6B to 9B on the right side of the memory module by a daisy chain wiring.

The clock signals 50 are first transmitted to the PLL 1104 on the memory module 1100 through a clock wiring. Then, they are separately wired one by one from a PLL 1104 to the DRAMs 1 to 9 and the register 1103 through a clock signal wiring group 1106 having the same length. Note that the DRAMs 1B to 9B share signals with the DRAMs 1 to 9, respectively. In addition, another clock signal CLK_DC (also written as "CLK_DC signal" and "CLK_DC"), which is different from the clock signal wiring group 1106, is connected through a daisy chain wiring 1107 to the DRAMs 1 to 5 and the DRAMs 1B to 5B on the left side of the memory module. Similarly, they are also connected through a daisy chain wiring to the DRAMs 6 to 9 and the DRAMs 6B to 9B on the right side of the memory module. Note that lengths of the C/A_DC signal wiring 1105 and CLK_DC signal wiring 1107 are adjusted so that the delay time of the C/A_DC signals is equal to that of the CLK_DC signals, and thus a rising edge of the CLK_DC signals is synchronized with the timing of taking in the C/A_DC signals. In addition, such daisy chain wiring is terminated with an appropriate source voltage such as a ground level or half of the source voltage, at the termination resistor such as effective characteristic impedance of the signal wiring, in opposite ends of the register 1103 and the PLL 1104.

Line lengths of a wiring group of the data signals 52, a wiring group of the C/A signals 51, and a wiring length of the clock signals 50 are designed so that the timing of the clock signals to be inputted to the PLL 1104, the timing of being inputted by the clock signal wiring group 1106 into each DRAM and the register 1103, and the timing of taking in the data signals by each DRAM become equal. The timing is referred to as "cycle timing φ0" of the memory system.

Now, since the C/A signals C/A_DC and the clock signals CLK_DC are connected to each DRAM by the daisy chain wiring, the arrival time of the signals to each DRAM differs. In particular, the clock signal CLK_DC in each DRAM differs from the above-mentioned cycle timing φ0. Thus, in each DRAM, there is mounted a clock switching circuit 1300 (FIG. 13) for changing the timing so that the C/A_D signals to be taken in by the clock signals CLK_DC can be taken in by the cycle timing φ0.

Figure 16:
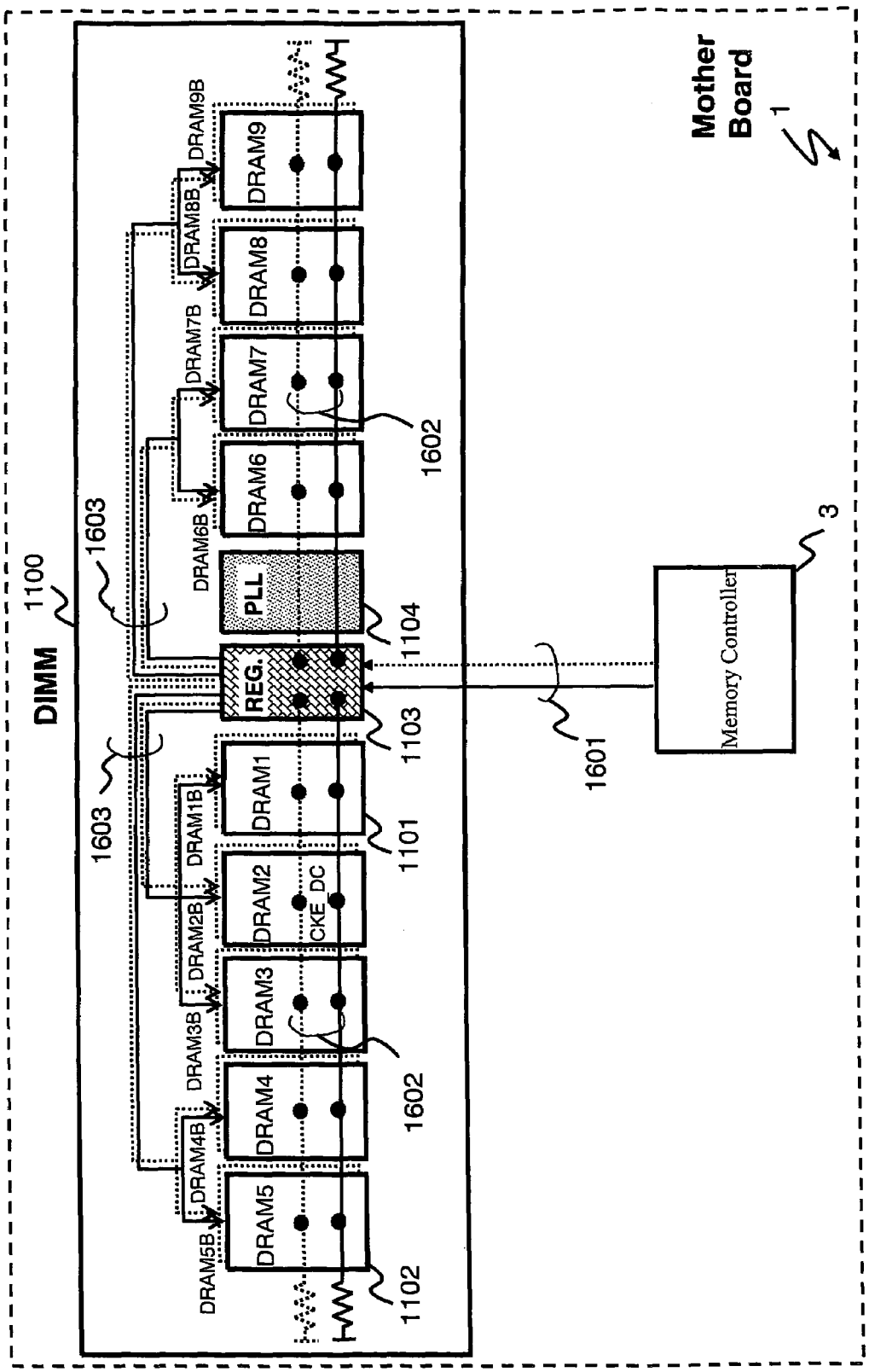
FIG. 16 is a view for explaining a clock-enable wiring in a fourth embodiment of the present invention.

FIG. 16 is a block diagram showing connection of the clock-enable signals in this embodiment. The clock-enable signals are ones for enabling the clock in each DRAM. On the motherboard, the clock-enable signals 1601 are connected to the register 1103 from the memory controller 3, similar to the C/A signals 51. In addition, on the memory module, a first clock-enable signal 1602 is connected to each of the DRAMs by a daisy chain wiring, and the wiring length of this signal 1602 is designed so that the signal has the same delay time as that of the clock signal CLK_DC line 1107 in each DRAM. In addition, on the memory module, a second clock-enable signal 1603 is connected from the register 1103 to every DRAM group of the same rank by a tree-shaped wiring, and the line length is designed so that the signals can simultaneously arrive at each connected DRAM. In Figure, solid lines 1601 to 1603 are used for the rank 1 and dotted lines are used for the rank 2. the reason that this embodiment has two systems of such clock-enable signals will be described later. Note that chip select signal wirings may only be the same daisy chain wiring as that of the C/A signals for every DRAM group of the same rank.

Figure 12:
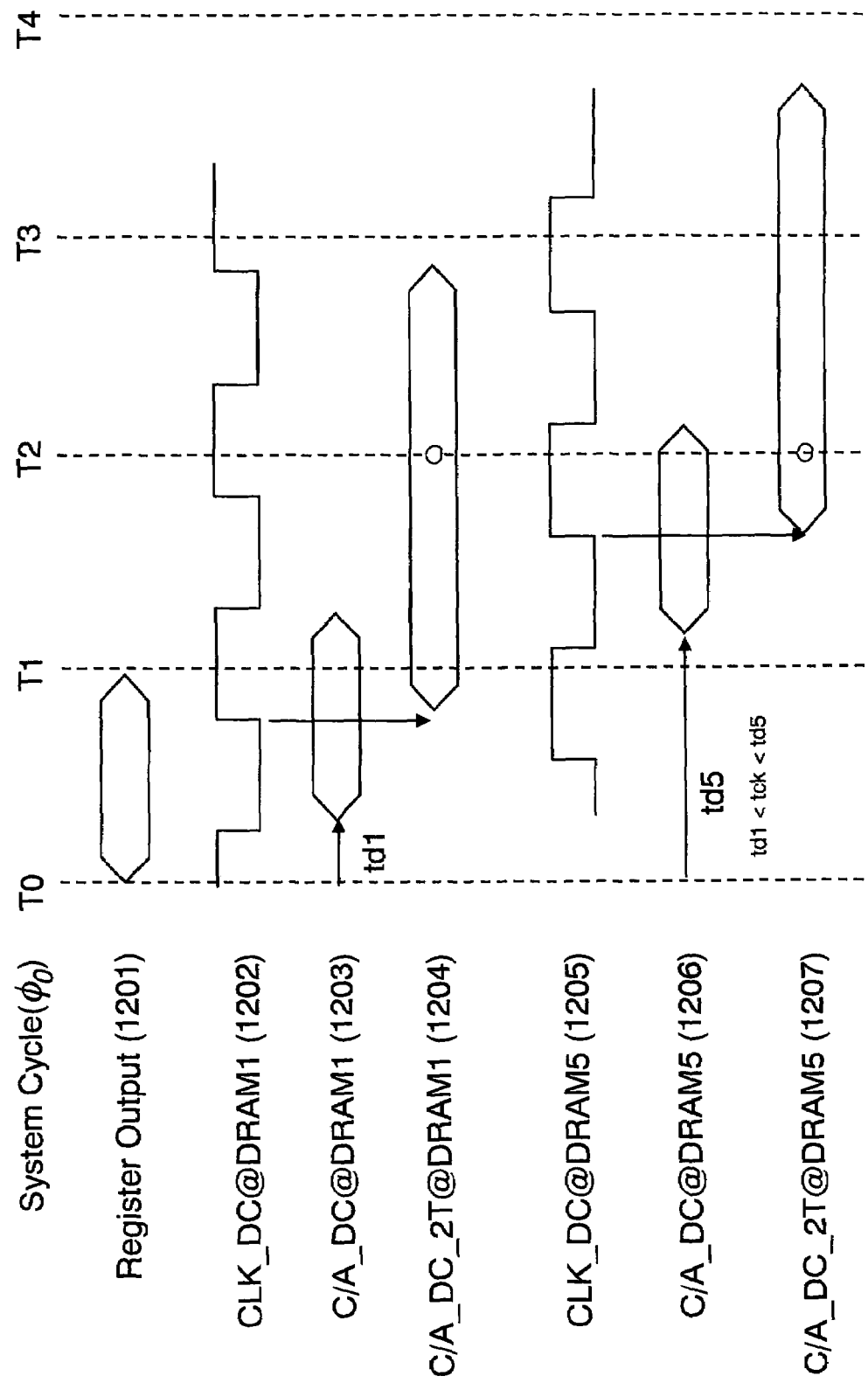
FIG. 12 is a view for explaining timing of C/A signals in a fourth embodiment of the present invention.

FIG. 12 is a timing chart that schematically shows the timing of transmission of the C/A signals associated with the register 1103 of the memory module 1100, the DRAM 1 (1101), and the DRAM 5 (1102).

In FIG. 12, the reference numerals "T0" to "T4" denote time of the cycle timing φ0. First, at T0, the register 1103 outputs the C/A signal (1201). The clock signal CLK_DC is transmitted with a timing of "1202" and the C/A signal C/A_DC is transmitted with a timing of "1203". Now, the C/A signal C/A_DC arrives from T0 with a delay time of "td1". At the farthest DRAM 5 (1102) from the register 1103, the clock signal CLK_DC is transmitted with a timing of "1205" and the C/A signal C/A_DC is transmitted with a timing of "1206". Here, the C/A signal C/A_DC arrives from "T0" with a delay time of "td5".

When the transfer frequency (data rate) of the C/A signal is high and complies with "td1<tck<td5" ("tck" is a cycle time), the C/A_DC signal cannot be taken in with "T1" in the DRAM 1 (1101) but cannot be taken in with "T1" in the DRAM 5 (1102). Thus, the above signal has to be taken in with "T2". As a result, the clock switching circuit 1300 (See FIG. 13) in each DRAM is used to reduce the transfer frequency of the C/A_DC signal, thus allowing the C/A_DC signal to be taken in at common time in each DRAM.

First, in the DRAM 1 (1101), the C/A_DC signal is taken in by the clock signal CLK_DC, and then the clock switching circuit 1300 (FIG. 13) generates a C/A_DC_2T (1204) that is obtained by halving the transfer frequency of the C/A_DC signal, i.e., doubling the data window. Similarly, even in the DRAM 5 (1102), the C/A_DC signal is taken in by the clock signal CLK_DC, and then the clock switching circuit 1300 (FIG. 13) generates the C/A_DC_2T (1207) by halving the transfer frequency of the C/A_DC signal, i.e., doubling the data window. Then, the C/A_DC_2T (1204) in the DRAM 1 (1101) and the C/A_DC_2T (1207) in the DRAM 5 can be taken in at a common time T2.

Figure 13:
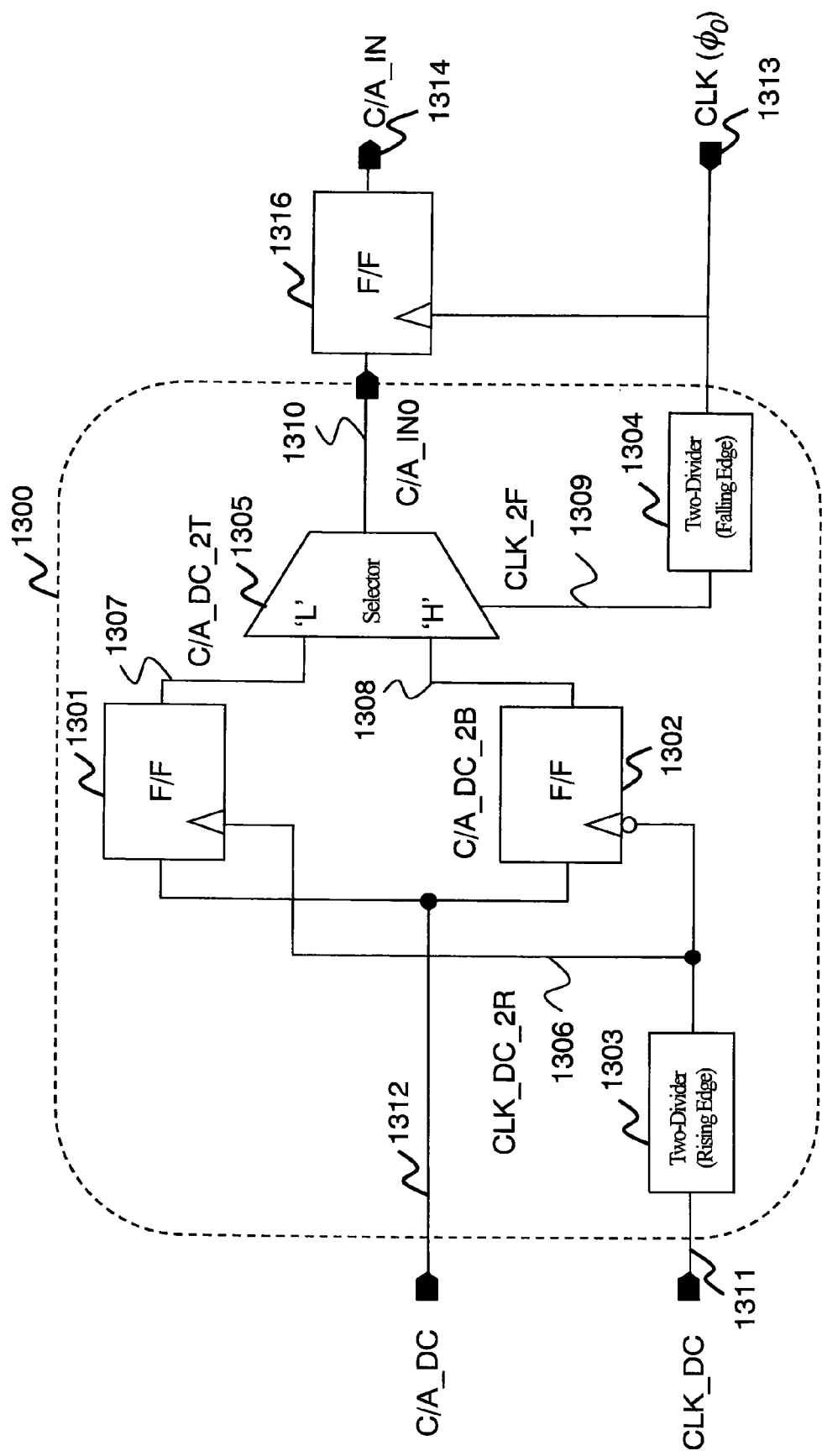
FIG. 13 is a view for explaining a clock switching circuit in a fourth embodiment of the present invention.

FIG. 13 is a block diagram of the above-mentioned clock switching circuit 1300 mounted on the DRAM.

This clock switching circuit has: a C/A_DC signal-input terminal 1312; a CLK_DC signal-input terminal 1311; a cycle-timing clock CLK signal-input terminal 1313; and a signal C/A_IN0 signal-output terminal 1310 for DRAM internal C/A. The interior of the clock switching circuit comprise a two-divider 1303 of a rising edge standard, a D flip flop 1301 of a rising edge standard, a D flip flop 1302 of a falling edge standard, a two-input one-output selector 1305, and a two-divider 1304 of a falling edge standard.

The CLK_DC signal-input terminal 1311 is connected to the input of the two-divider 1303 of a rising edge standard, and an output signal CLK_DC_2R (1306) is given to the clock input terminals of the D flip flop 1301 of a rising edge standard and the D flip flop 1302 of a falling edge standard. In addition, a C/A_DC signal terminal 1312 is given to the data signal-input terminals of the D flip flop 1301 of a rising edge standard and the D flip flop 1302 of a falling edge standard. The output signal C/A_DC_2T (1307) of the D flip flop 1301 of a rising edge standard and the output signal C/A_DC_2B (1308) of the D flip flop 1302 of a falling edge standard are given to the input signal terminals of the selector 1305. Meanwhile, the cycle-timing clock CLK signal-input terminal 1313 is given to the input terminal of the two-divider 1304 of a falling edge standard, and its output signal CLK_2F (1309) is given to the selection signal terminal of the selector 1305. Then, the output signal of the selector 1305 is outputted to the C/A_IN0 signal-output terminal 1310 of the clock switching circuit 1300.

Note that the C/A_IN0 signal of the output terminal 1310 of this clock switching circuit is inputted to the flip flop 1316 that takes in the C/A signal with the cycle timing φ0.

Figure 14:
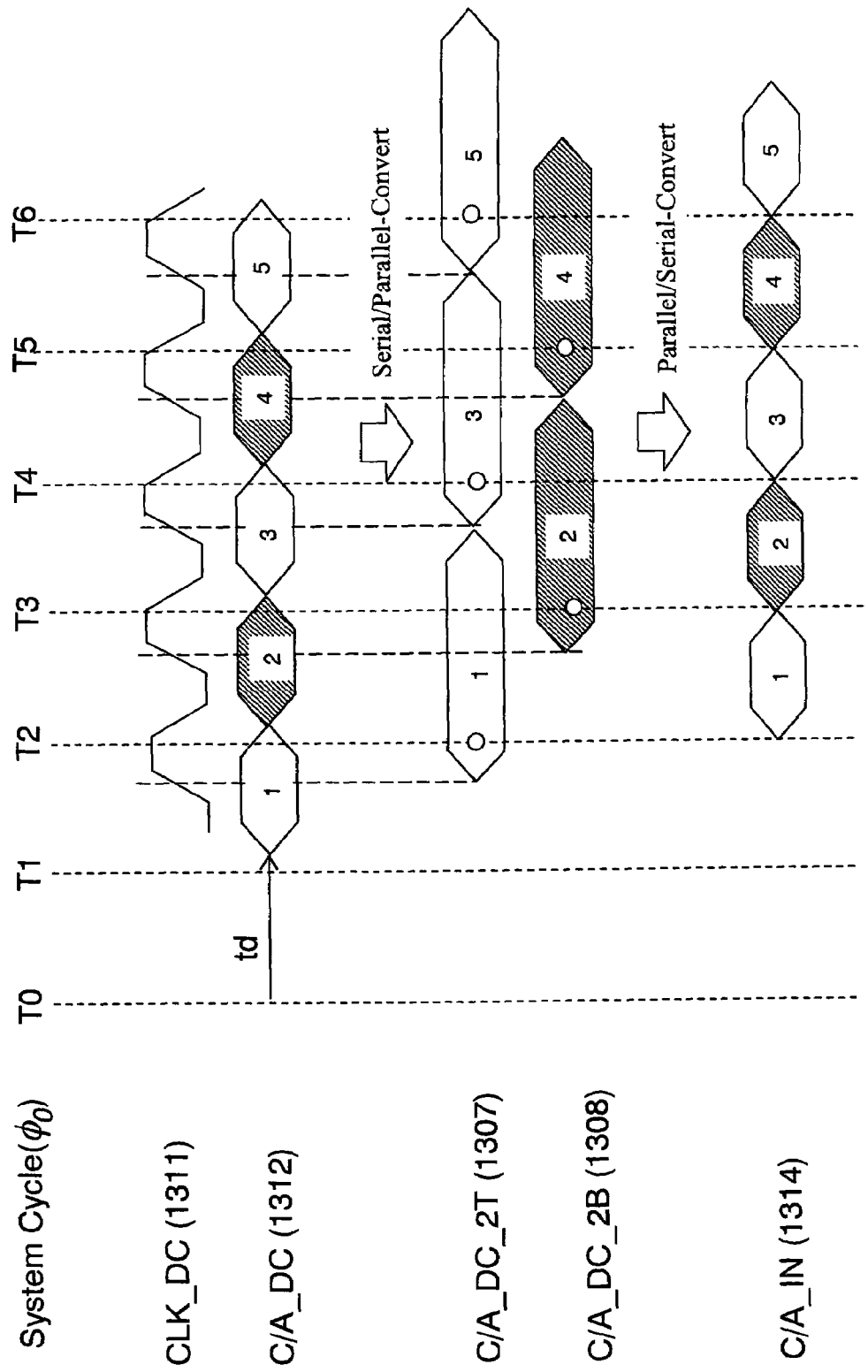
FIG. 14 is a view for explaining timing of a clock switching circuit in a fourth embodiment of the present invention.

Next, the principle of an operation of this clock switching circuit 1300 will be described. FIG. 14 is a schematic timing chart in a circuit, which indicates the principle of the clock switching circuit.

The C/A_DC signal 1312 and the CLK_DK signal 1311 on the memory module (DIMM) are transmitted to each DRAM by a daisy chain wiring that runs together to either a right end or left end from the vicinity of the midpoint of the memory module, so that a phase relationship between the both signals in each DRAM is almost equal, as shown in FIG. 14.

First, the clock switching circuit 1300 of each DRAM takes in the C/A_DC signal 1312 with the timing of the CLK_DC signal 1311. Then, it serial/parallel-converts the C/A_DC signals, and converts one C/A_DC signal into two signals, namely, the signals C/A_DC_2T (1307) and C/A_DC_2B (1308) that are obtained by halving the transfer frequency.

Then, after parallel/serial-converting the C/A_DC_2T (1307) and the C/A_DC_2B (1308), there is re-synthesized the "C/A signal=C/A_IN0 (1310)" that can be taken in with the cycle timing φ0 common to respective DRAMs, and there is obtained the C/A signal C/A_IN (1314) synchronized with the timing φ0 by the flip flop 1316 for taking in the C/A signal.

Figure 15:
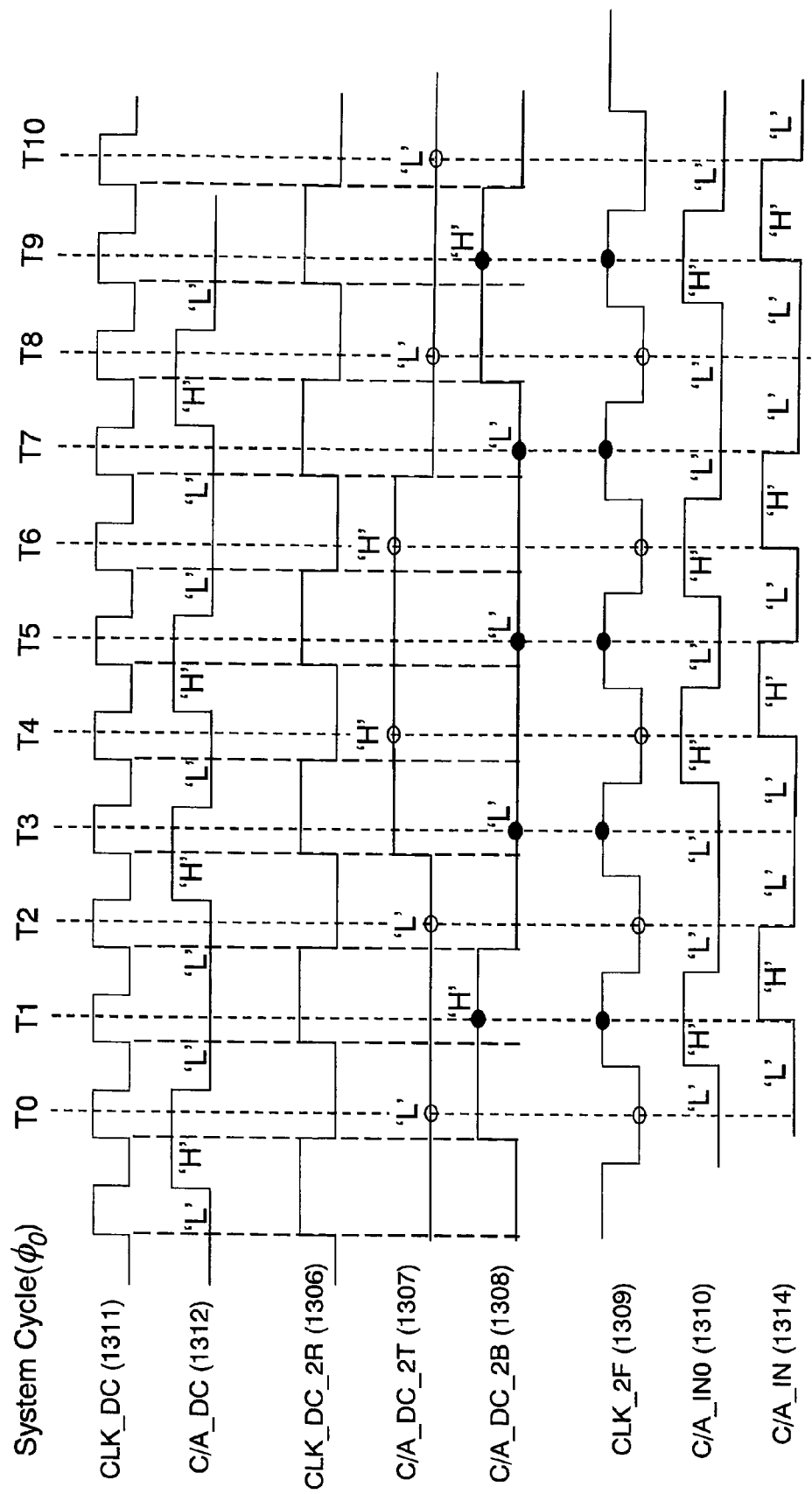
FIG. 15 is a view for explaining in detail timing in a fourth embodiment of the present invention.

Based on the above description, an operation of this clock switching circuit 1300 will be described. FIG. 15 is a detailed timing chart of the clock switching circuit.

In the clock switching circuit 1300, first, the two-dividing clock CLK_DC_2R (1306) is generated from the CLK_DC (1311: first clock). Then, in the D flip flop 1301 of a rising edge standard, the C/A_DC (1312: first signal) is taken in by the rising edge of the two-dividing clock CLK_DC_2R (1306), whereby the C/A_DC_2T (1307) is generated. In addition, similarly, the C/A_DC_2B (1308) takes in and generates the C/A_DC signal 1312 by the two-dividing clock CLK_DC_2R (1306) in the D flip flop 1302 of a falling edge standard.

Next, from the clock signal CLK (1313) at the cycle timing φ0, the two-dividing clock CLK_2F (1309: dividing clock of second clock) of a falling edge standard is generated by the two-divider 1304 and given to the selector 1305. Thereby, the selection signals are alternately switched and outputted at a falling edge of "φ0". Thus, the C/A_DC_2T (1307) at "T2", "T4", "T6" that are the rising edges of "φ0", and the C/A_DC_2B (1308) at "T3", "T5", . . . , are set up in the C/A_IN0 (1310). Note that the two-divider in the circuit is reset with the timing of the clock-enable signals that correspond to the associated clocks. Since the clock-enable signals 1601 are simultaneously inputted to the respective DRAMs, initialization timing of the two-divider 1304 becomes equal in each of the DRAMs and the CLK_2F (1309) becomes equal in each DRAM.

Then, the C/A_IN0 (1310) is inputted to the flip flop 1316 that takes in the C/A signal at the cycle timing φ0, and thus the C/A signal C/A_IN (1314) synchronized with the timing φ0 can be obtained.

Thus, the C/A signal can be switched from the clock signal CLK_DC (1311) to the cycle timing φ0, i.e., the clock signal 1106 (second clock).

In addition, in the above description, an example of parallelism 2 by assuming that the "td1<tck<td5<2tck" is formed has been described. However, the parallelism may be changed depending on any condition. In the case of the "(N−1)×tck<td5<N×tck", the parallelism is required to become N or higher.

Note that a so-called registered DIMM, in which the register and the PLL are mounted on the memory module and the C/A signals are distributed to each memory through the register and the clock signals are distributed to each memory through the PLL, has been described in the present invention. However, needless to say, the present invention can also be implemented in a so-called un-buffered DIMM, which has no register and PLL and in which the C/A signals and the clock signals are directly distributed in the memory module.

Fifth Embodiment

A fifth embodiment will be described with reference to FIG. 17.

Figure 17:
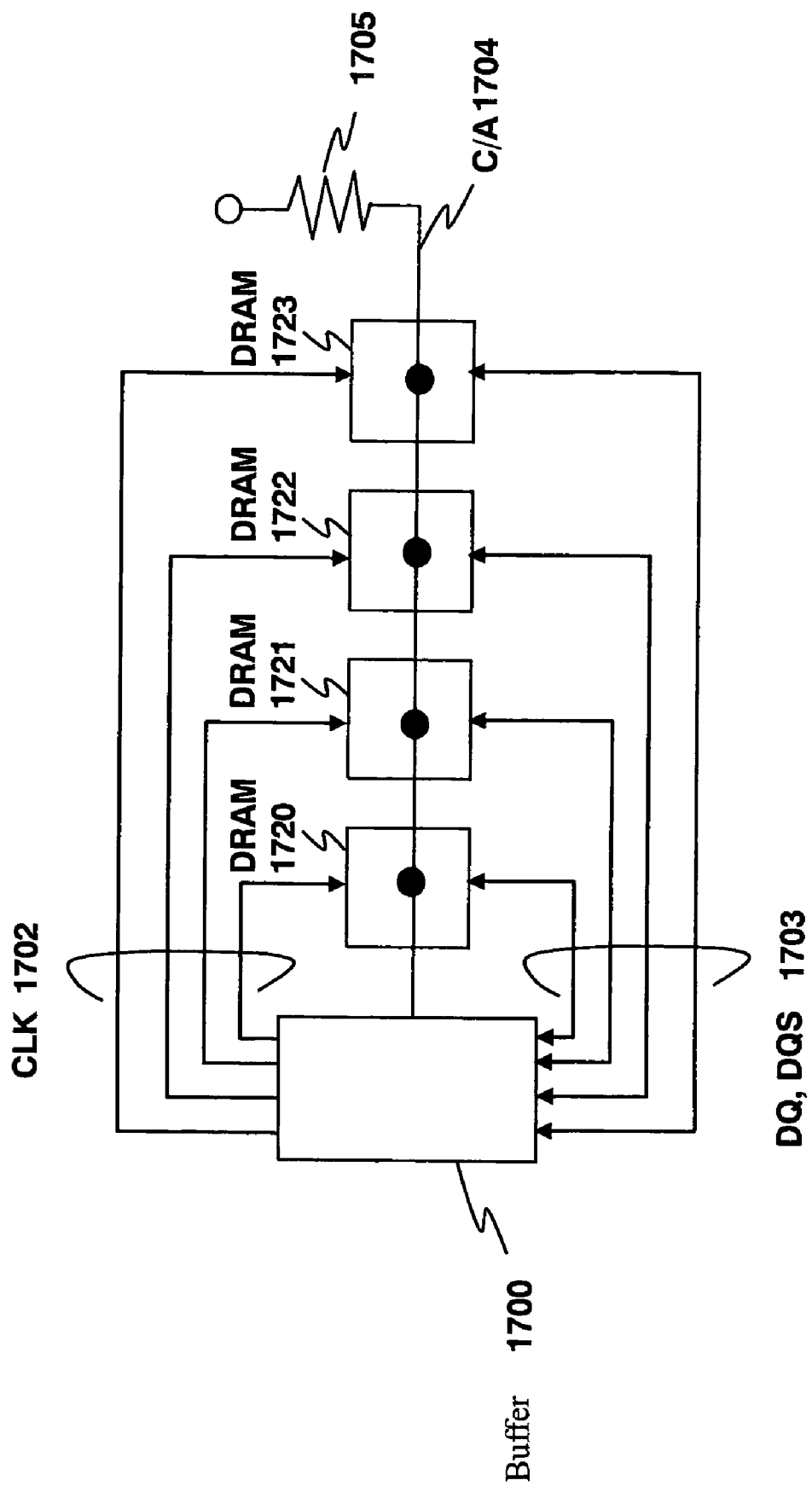
FIG. 17 is a view for explaining a memory module according to a fifth embodiment of the present invention.

FIG. 17 is a block diagram of a memory module of a fifth embodiment. On the DIMM (not shown), a buffer 1700 and several DRAMs 1720 to 1723 are mounted. The DQ and DQS 1703 are exchanged between the buffer 1700 and the DRAMs, and CLK 1702 and a command/address (C/A) signal 1704 are outputted from the buffer 1700. The buffer 1700 is configured so as to contain a portion of functions of the REG. 20, the PLL 30, and the MC 3 in FIG. 1. The signals are also exchanged between the buffer 1700 and the MC (not shown).

In this case, the C/A 1704 is terminated at a termination resistor 1705 by utilizing a daisy chain topology similarly to FIG. 1. The CLK 1702 and the "DQ, DQS" 1703 are wired using a Point-to-Point topology.

Figure 18B:
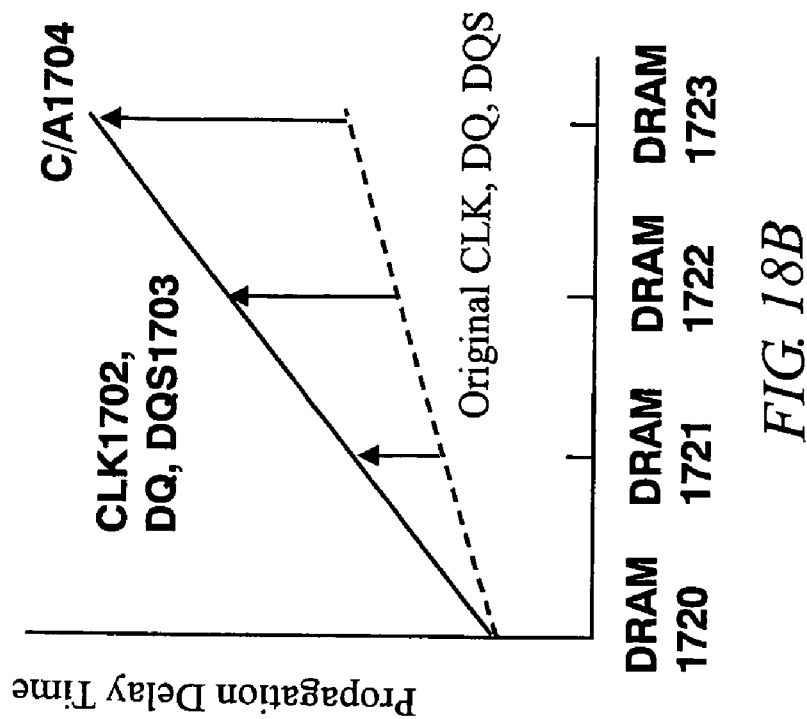
FIG. 18B is a view for explaining a relation between a memory location and a propagation delay time after delay in a fifth embodiment of the present invention.
Figure 18A:
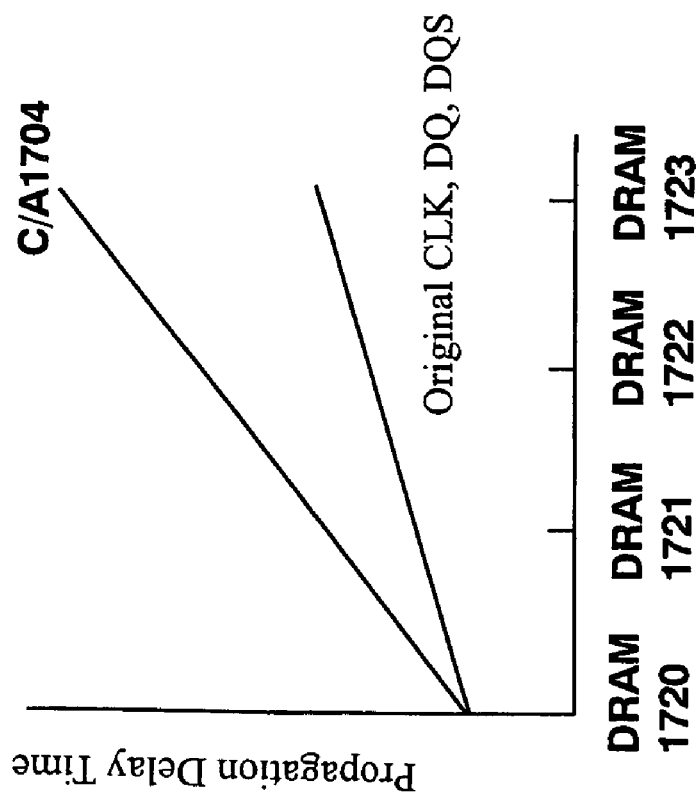
FIG. 18A is a view for explaining a relation between a memory location and a propagation delay time prior to delay in a fifth embodiment of the present invention.

FIG. 18A shows a propagation delay time of each signal from the buffer 1700 to each of the DRAMs 1720 to 1723. Since the "CLK, DQ, DQS" are wired using the same Point-to-Point topology, their propagation delay times can be matched relatively easily. However, only the C/A 1704 is formed using a daisy chain topology, so that generally speaking, the farther the DRAM is, the greater propagation delay time it have in comparison with the "CLK, DQ, DQS".

First, the "CLK, DQ, DQS", whose propagation delay times can be matched relatively easily, will be described. The "CLK, DQS" signals are signals repeated by "0101" patterns, while the DQ signal is a signal having various types of patterns. Thus, signal quality is affected by ISI (Inter Symbol Interference), i.e., influence of data pattern dependency. Consequently, if the wiring length of the DQ is set a little shorter than that of the DQS signal, the setup margin of the DQ with respect to the DQS can be equal to a hold margin. In the CLK and the DQS, their respective wiring lengths may be adjusted.

Then, in the condition of FIG. 18A, the setup margin of the C/A with respect to the CLK runs short and thus the CLK cannot capture the C/A 1704. Therefore, as shown in FIG. 18B, the "CLK, DQ, DQS" must be delayed. They can be delayed by the following method: first, each wiring length of the CLK, the DQ, and the DQS is adjusted; in each of the DRAMs, as shown in FIG. 8B, phases of the C/A and the "CLK, DQ, DQS" are examined, and by returning their information to the buffer 1700, the timing of "CLK, DQ, DQS" outputted from the buffer 1700 may be changed; or, as shown in FIG. 4, they are delayed inside the DRAMs.

Using this method, the present embodiment can solve the problems of the setup margin and the hold margin of the DQ with respect to the DQS, and the problem of the setup margin of the C/A with respect to the CLK, so that the memory module that is consistent in the timing of both signals can be implemented.

Sixth Embodiment

A sixth embodiment will be described with reference to FIG. 19.

Figure 19:
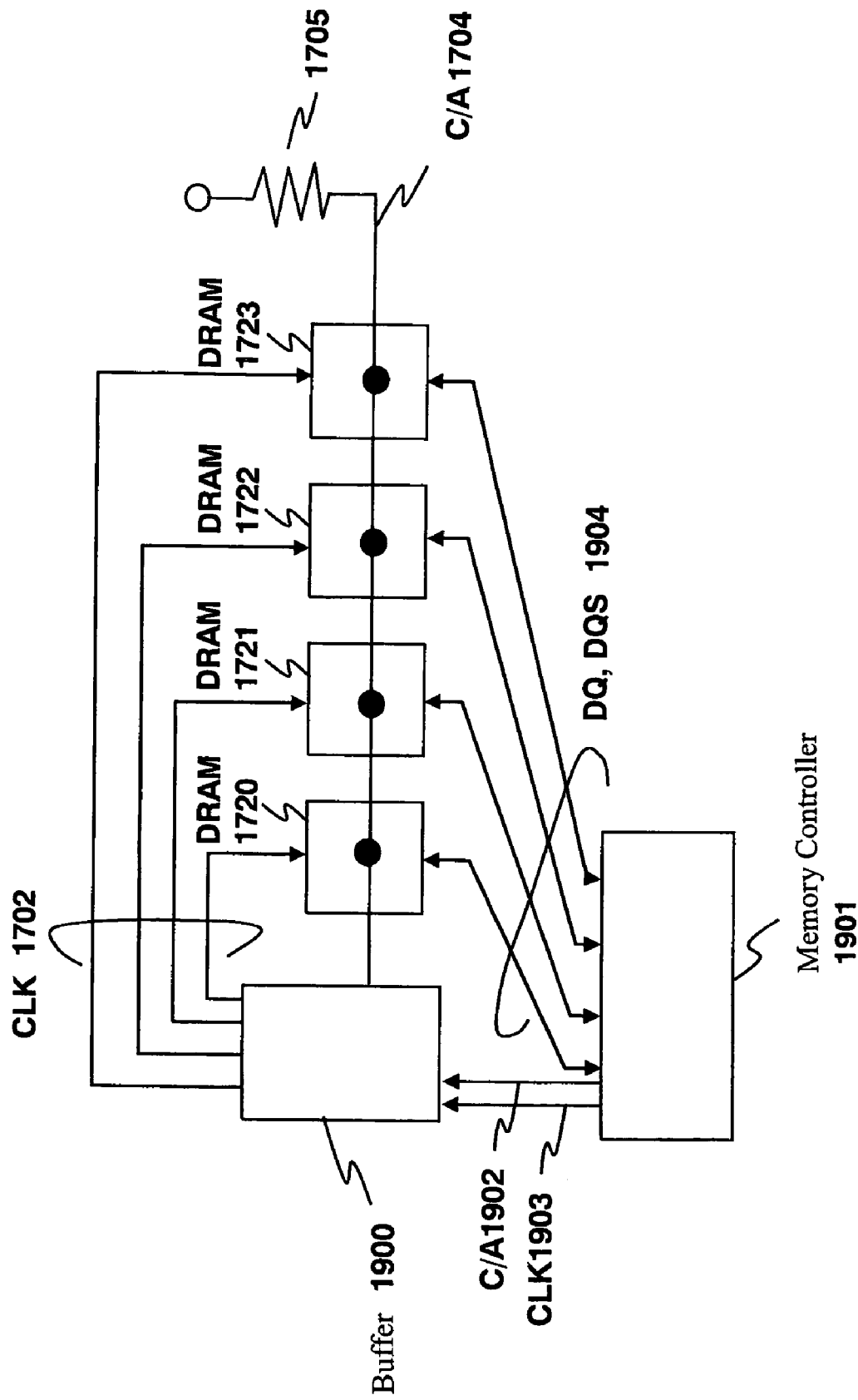
FIG. 19 is a view for explaining a memory module according to a sixth embodiment of the present invention.

FIG. 19 is a block diagram of a memory module of a sixth embodiment. On the DIMM (not shown), a buffer 1900 and several DRAMs 1720 to 1723 are mounted. A "DQ, DQS" 1904 is exchanged between a memory controller 1901 and the DRAMS, and the C/A 1902 and the CLK 1903 are outputted from the memory controller 1901 to the buffer 1900. From the buffer 1900, the CLK 1702 and the command/address (C/A) signals 1704 are outputted based on the C/A 1902 and the CLK 1903 inputted in the buffer 1900.

In this case, the C/A 1704 is wired using a daisy chain topology similarly to FIG. 1, and is terminated at the termination resistor 1705. the CLK 1702 and the "DQ, DQS" 1904 are formed into a Point-to-Point topology.

Figure 20B:
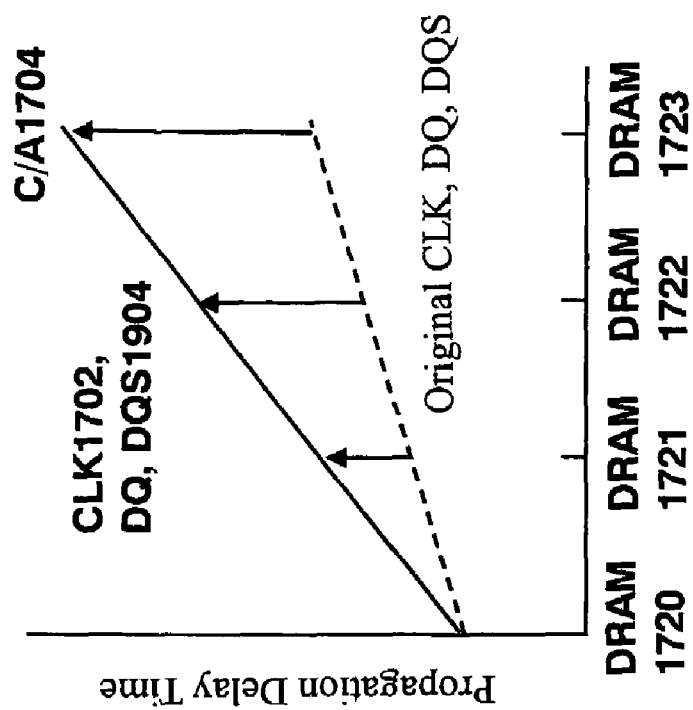
FIG. 20B is a view for explaining a relation between a memory location and a propagation delay time after delay in a sixth embodiment of the present invention.
Figure 20A:
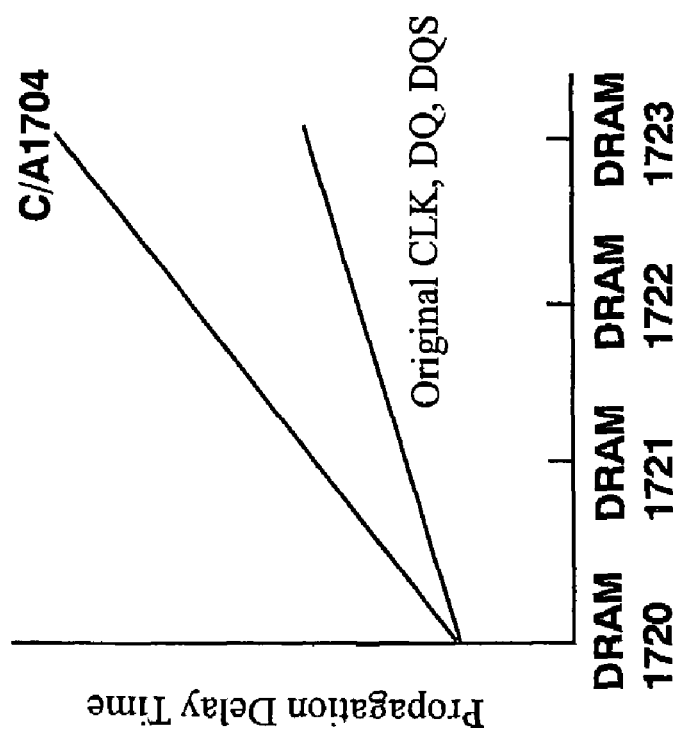
FIG. 20A is a view for explaining a relation between a memory location and a propagation delay time prior to delay in a sixth embodiment of the present invention.

FIG. 20A shows a propagation delay time of the CLK signals from the buffer 1900 to each of the DRAMs 1720 to 1723, and an arrival time of the "DQ, DQS" signals to each of the DRAMs. Since the "CLK, DQ, DQS" is wired using the same Point-to-Point topology, the propagation delay time can be matched relatively easily. Then, the propagation delay time can be matched easily if the phase relation between the CLK 1903 inputted to the buffer 1900 and the CLK 1702 outputted from the buffer 1900 in a pin position of the buffer 1900 is set to variable. However, only the C/A 1704 is wired using a daisy chain topology, so that, generally speaking, the farther the DRAM is, the greater propagation delay time it has in comparison with the CLK.

First, the "CLK, DQ, DQS", whose propagation delay time is matched relatively easily, will be described. The "CLK, DQS" signals are signals repeated by "0101" patterns, while the DQ signal is a signal having various types of patterns. Therefore, signal quality is affected by ISI (Inter Symbol Interference), i.e., influence of data pattern dependency. Consequently, if the wiring length of the DQ is set a little shorter than that of the DQS signal, the setup margin and the hold margin of the DQ wit respect to the DQS are made equal to each other. In the CLK and the DQS, their respective wiring lengths may be adjusted.

Then, in the condition of FIG. 20A, the setup margin of the C/A with respect to the CLK runs short and thus the CLK cannot capture the C/A 1704. Therefore, as shown in FIG. 20B, the "CLK, DQ, DQS" must be delayed. A method of delaying it is that: first, each wiring length of the CLK, the DQ, and the DQS is adjusted; as in FIG. 8, in each of the DRAMs, phases of the C/A and the "CLK, DQS" are examined in each DRAM, and by returning their information to the buffer 1900 and the memory controller 1901, and the timing of the "CLK, DQ, DQS" outputted from the buffer 1900, and the memory controller 1901 is changed; or, as shown in FIG. 4, they are delayed inside the DRAMs.

Using the method, similarly to the fifth embodiment, the present embodiment can implement the memory module that is consistent in the timing of both signals.

What is claimed is:

1. A semiconductor memory module, on which a plurality of semiconductor memory elements each having terminals for data signals, address/control signals, and clock signals are mounted, the semiconductor memory module comprising:

clock signal lines wired so that said clock signals are in phase with the semiconductor memory elements;

data signal lines wired to the semiconductor memory elements so as to have the same length;

a register setting said address/control signals; and an address/command signal line wired in a daisy-chain shape to said semiconductor memory elements from said register, wherein each of said semiconductor memory elements has a variable delay circuit with respect to said address/control signals or to said clock signals for taking in said address/control signals, and a delay amount of said variable delay circuit is set so that the sum of said delay amount and a wiring delay time due to a wiring from said register becomes equal to a wiring delay time from said register to the farthest one among said semiconductor memory elements, or a delay amount of said variable delay circuit is set so that the sum of said delay amount and arrival timing of said clock signals to said semiconductor memory elements becomes equal to a wiring delay time from said register to said semiconductor memory elements.

2. The semiconductor memory module according to claim 1, wherein each of said semiconductor memory element comprises:

a clock stabilizing circuit that, with respect to said clock signals, reduces jitter and distributes, as a common clock, said clock signals to blocks in said semiconductor memory elements, said common clock being set to an input of a variable delay circuit; and a register provided therein and setting a value for adjusting a delay time of said variable delay time.

3. The semiconductor memory module according to claim 2, wherein a value of said register is set by a boundary scan circuit.

4. The semiconductor memory module according to claim 3, wherein said boundary scan circuit and a non-volatile semiconductor element for boundary scan circuit are provided on said semiconductor memory module.

5. A semiconductor memory module, on which a plurality of semiconductor memory elements each having a terminal for data signals, a terminal for address/control signals, and a terminal for clock signals, the semiconductor memory module comprising:

a clock signal line connected to said terminal for clock signals and transmitting said clock signals;

a data signal line connected to said terminal for data signals and transmitting said data signals;

a register for setting said address/control signals; and an address/control line connected in a daisy-chain shape to said terminal for address/control signals from said register and transmitting said address/control signals, wherein each of said semiconductor memory elements has a variable delay circuit for delaying said address/control signals or said clock signals for taking in said address/control signals, and a delay amount of said variable delay circuit is set so that the sum of said delay amount and a wiring delay time due to a wiring from said register depends on a wiring delay time from said register to the farthest one among said semiconductor memory elements, or a delay amount of said variable delay circuit is set so that the sum of said delay amount and arrival timing of said clock signals to said semiconductor memory elements depends on a wiring delay time from said register to said semiconductor memory elements.

* * * * *